US012315285B2

(12) United States Patent
Bae et al.

(10) Patent No.: US 12,315,285 B2
(45) Date of Patent: *May 27, 2025

(54) DISPLAY DEVICE

(71) Applicant: SAMSUNG DISPLAY CO., LTD., Yongin-si (KR)

(72) Inventors: Kwang Soo Bae, Yongin-si (KR); Gee-Bum Kim, Yongin-si (KR); Bokwang Song, Yongin-si (KR); Dae-Young Lee, Yongin-si (KR); Min Oh Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/595,358

(22) Filed: Mar. 4, 2024

(65) Prior Publication Data
US 2024/0249552 A1 Jul. 25, 2024

Related U.S. Application Data

(63) Continuation of application No. 18/160,216, filed on Jan. 26, 2023, now Pat. No. 11,922,717.

(30) Foreign Application Priority Data

Apr. 7, 2022 (KR) .......... 10-2022-0043221

(51) Int. Cl.
G06V 40/13 (2022.01)
G06F 3/041 (2006.01)
(Continued)

(52) U.S. Cl.
CPC ........ *G06V 40/1318* (2022.01); *G06F 3/0412* (2013.01); *G06F 3/0421* (2013.01);
(Continued)

(58) Field of Classification Search
CPC .... G06F 3/042; G06F 3/0412; G06F 3/04164; G06F 3/044; G06F 3/0443; G06F 3/0446;
(Continued)

(56) References Cited

U.S. PATENT DOCUMENTS 10,552,696 B2  2/2020  Cho et al.
10,936,126 B2  3/2021  Lee et al.
(Continued)

FOREIGN PATENT DOCUMENTS

KR  10-2018-0067196 A  6/2018
KR  10-2020-0049959 A  5/2020
KR  10-2021-0086907 A  7/2021

*Primary Examiner* — Nelson M Rosario
(74) *Attorney, Agent, or Firm* — Womble Bond Dickinson (US) LLP

(57) ABSTRACT

A display device includes: a display panel including a light emitting element and a photosensitive element; an input sensor comprising a sensing electrode on the display panel; and an anti-reflection layer on the input sensor. The anti-reflection layer includes: a light shielding pattern having a first opening corresponding to the light emitting element and a second opening corresponding to the photosensitive element. The sensing electrode includes a plurality of line portions, the plurality of line portions includes a first line portion overlapping the light shielding pattern and arranged between the first opening and the second opening on a plane. A distance between the first line portion and an edge of the second opening is less than a distance between the first line portion and an edge of the first opening.

20 Claims, 19 Drawing Sheets

(51) Int. Cl.
  *G06F 3/042* (2006.01)
  *G09G 3/3233* (2016.01)
  *H10K 59/126* (2023.01)
  *H10K 59/65* (2023.01)
  *H10K 59/35* (2023.01)

(52) U.S. Cl.
  CPC ......... *G09G 3/3233* (2013.01); *H10K 59/126* (2023.02); *H10K 59/65* (2023.02); *G09G 2300/0426* (2013.01); *G09G 2300/0819* (2013.01); *G09G 2300/0842* (2013.01); *G09G 2300/0861* (2013.01); *G09G 2310/08* (2013.01); *G09G 2360/14* (2013.01); *H10K 59/35* (2023.02)

(58) Field of Classification Search
  CPC ...... G06F 2203/04112; G06V 40/1318; G06V 40/13; G06V 40/1365; G09G 3/3225; G09G 2320/0626; G09G 2354/00; G09G 2360/144; H01L 25/165; H01L 25/167; H01L 31/03762; H01L 31/075; H01L 31/153; H01L 31/173; H10K 50/841; H10K 59/122; H10K 59/131; H10K 59/40; H10K 59/65; H10K 65/00; H10K 59/60; H10K 50/865; Y02E 10/548
  See application file for complete search history.

(56) References Cited

U.S. PATENT DOCUMENTS

| | | | |
|---|---|---|---|
| 2019/0371865 A1* | 12/2019 | Lee | H10K 59/8792 |
| 2020/0066804 A1* | 2/2020 | Jung | H10K 50/858 |
| 2021/0064159 A1 | 3/2021 | Yazdandoost et al. | |
| 2021/0158751 A1* | 5/2021 | Cha | H10K 65/00 |
| 2021/0200366 A1 | 7/2021 | Bok et al. | |
| 2021/0202592 A1 | 7/2021 | Kim et al. | |

\* cited by examiner

FIG. 5A
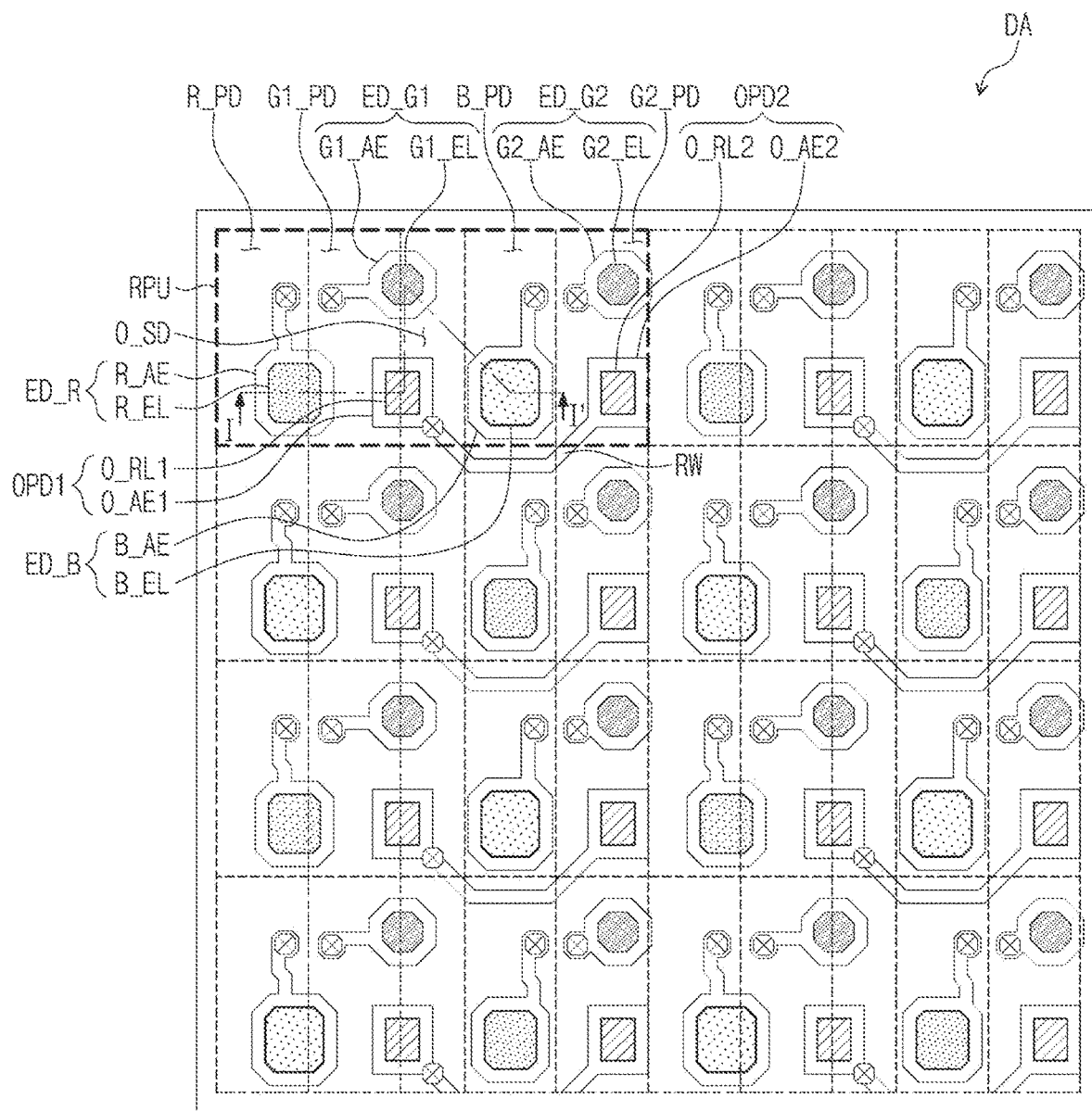
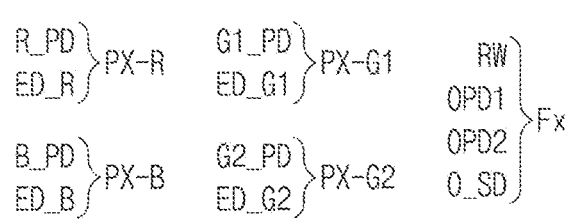

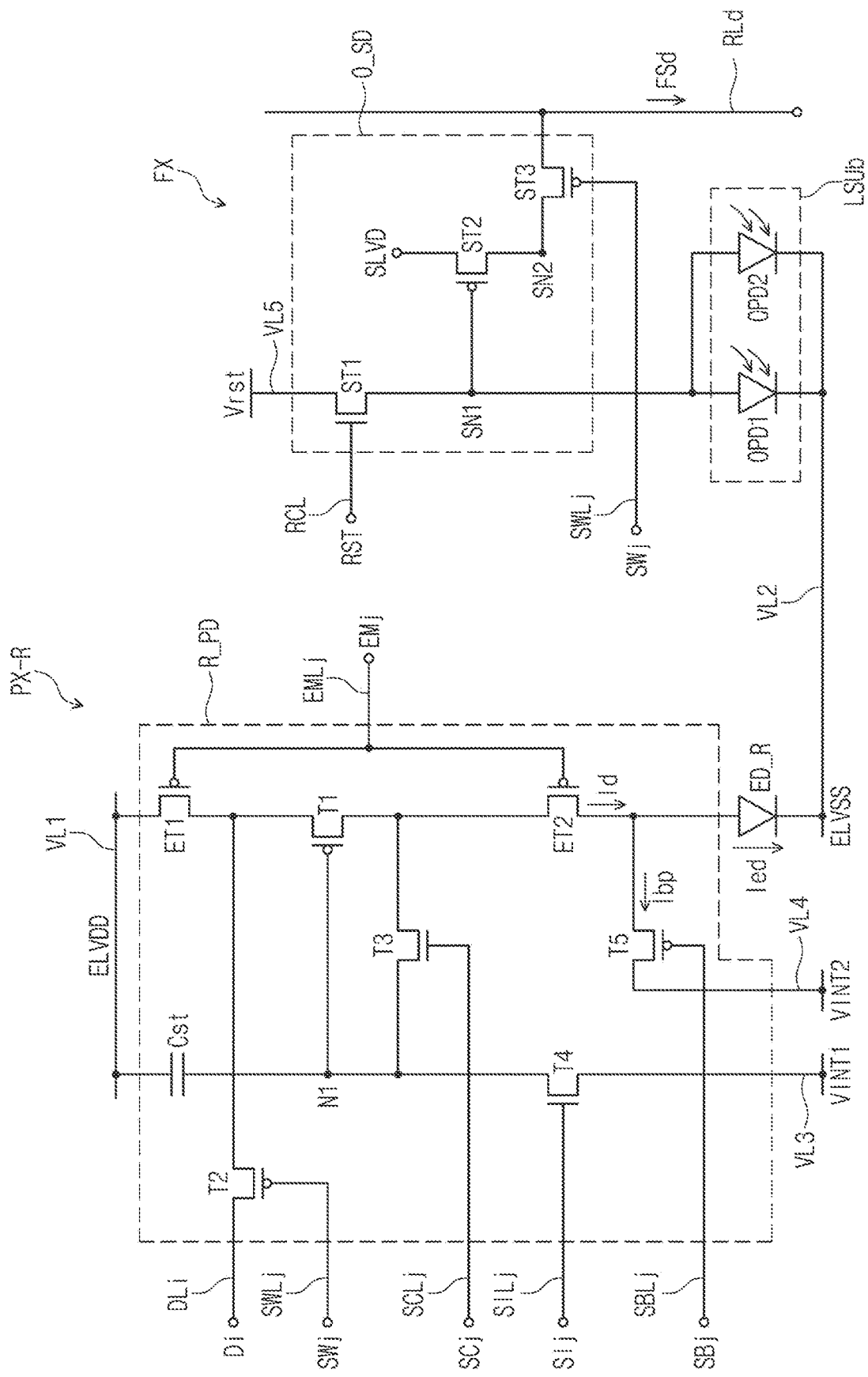

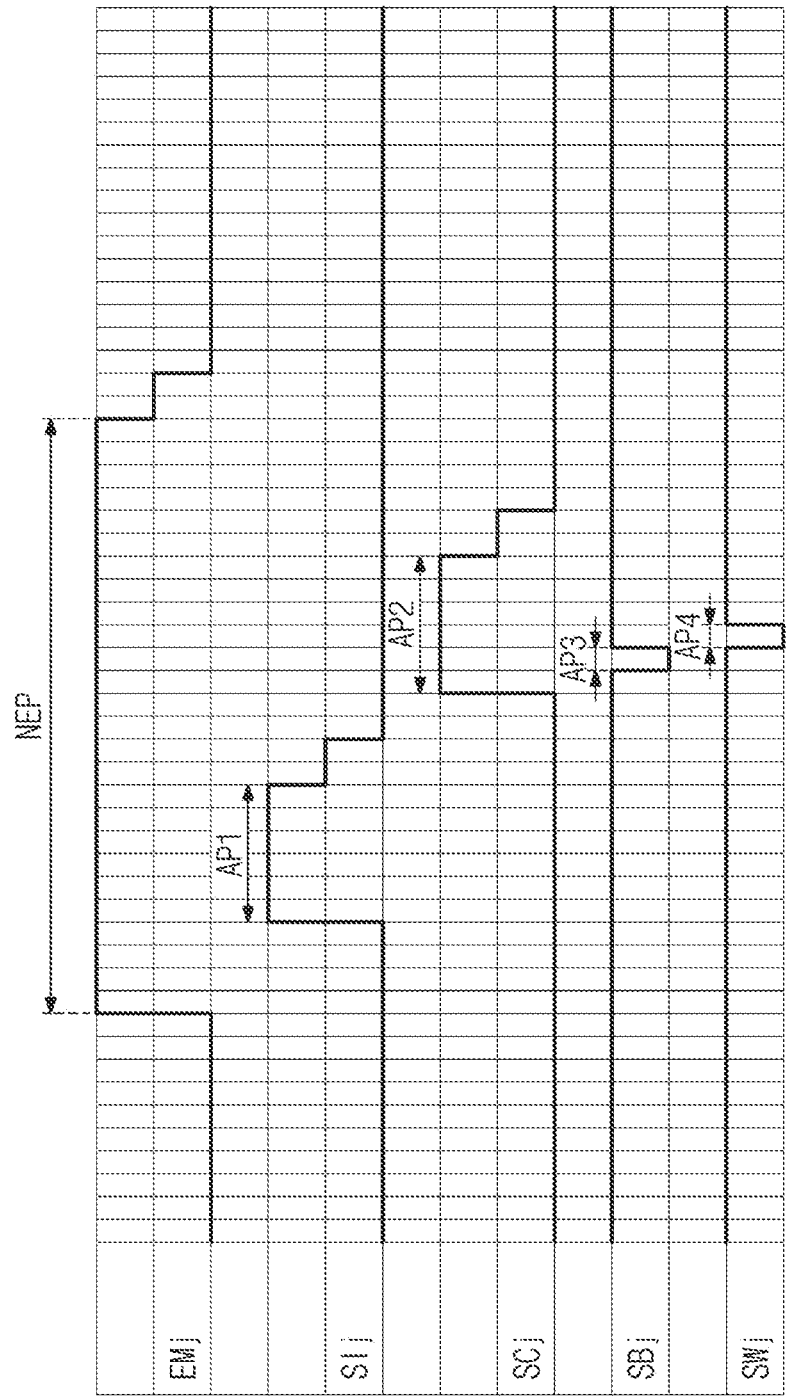

FIG. 11A
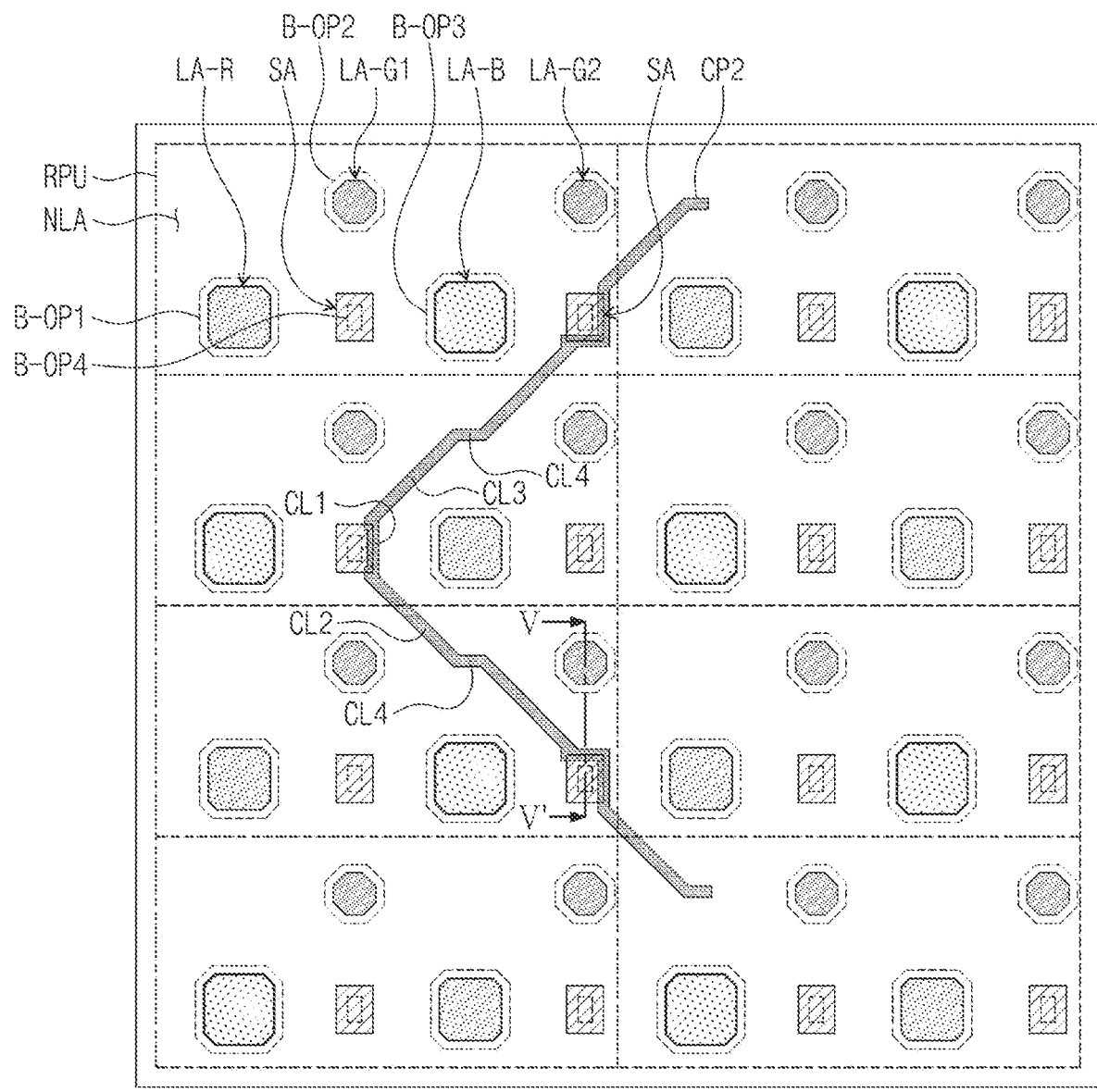
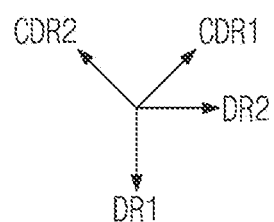

DISPLAY DEVICE

CROSS-REFERENCE TO RELATED APPLICATIONS

This application is a continuation of U.S. patent application Ser. No. 18/160,216, filed Jan. 26, 2023, which claims priority to and the benefit of Korean Patent Application No. 10-2022-0043221, filed Apr. 7, 2022, the entire content of both of which is incorporated herein by reference.

BACKGROUND

1. Field

Aspects of embodiments of the present disclosure relate to a display device.

2. Description of the Related Art

A display device provides various functions for organically communicating with a user by displaying an image to provide information to a user and/or sensing an input of a user. Recently, display devices have added functionality for sensing biometric information of a user.

Biometric information recognition methods include a capacitive method of sensing a variation in capacitance formed between electrodes, an optical method of sensing incident light by using an optical sensor, and an ultrasonic method of sensing a vibration by using a piezoelectric body.

SUMMARY

Embodiments of the present disclosure provide a display device including a sensor having improved sensitivity for biometric information recognition.

An embodiment of the present disclosure provides display device including: a display panel including: a base layer; a light emitting element on the base layer; a photosensitive element on the base layer; and a thin-film encapsulation layer covering the light emitting element and the photosensitive element; an input sensor including a sensing electrode on the display panel; and an anti-reflection layer on the input sensor. The anti-reflection layer includes: a light shielding pattern having a first opening corresponding to the light emitting element and a second opening corresponding to the photosensitive element; and a color filter. The sensing electrode includes a plurality of line portions, and the plurality of line portions includes a first line portion overlapping the light shielding pattern and arranged between the first opening and the second opening on a plane. A distance between the first line portion and an edge of the second opening is less than a distance between the first line portion and an edge of the first opening.

The light emitting element may include a first color light emitting element, a second color light emitting element, and a third color light emitting element. The first opening may have a first color opening corresponding to the first color light emitting element, a second color opening corresponding to the second color light emitting element, and a third color opening corresponding to the third color light emitting element.

The plurality of line portions may further include: a second line portion overlapping the light shielding pattern and arranged between the first color opening and the second color opening on the plane; and a third line portion overlapping the light shielding pattern and arranged between the second color opening and the third color opening on the plane. A distance between the second line portion and an edge of the first color opening may be substantially equal to a distance between the second line portion and an edge of the second color opening, and a distance between the third line portion and the edge of the second color opening may be substantially equal to a distance between the third line portion and an edge of the third color opening.

The color filter may include a first color filter overlapping the first color light emitting element, a second color filter overlapping the second color light emitting element, and a third color filter overlapping the third color light emitting element, and one of the first color filter, the second color filter, and the third color filter may further overlap the photosensitive element.

The first line portion may have a closed line shape defining an opening corresponding to the second opening on the plane.

The first line portion may overlap the photosensitive element on the plane.

The light shielding pattern may overlap the photosensitive element on the plane.

The display panel may further include a pixel defining layer having a first opening exposing a first electrode of the light emitting element and a second opening exposing a first electrode of the photosensitive element. On the plane, the first opening in the pixel defining layer may overlap the first opening in the light shielding pattern and the second opening in the light shielding pattern may overlap the second opening in the pixel defining layer.

The light emitting element may include first color light emitting elements, second color light emitting elements, and third color light emitting elements. One first color light emitting element of the first color light emitting elements, two second color light emitting elements of the second color light emitting elements, and one third color light emitting element of the third color light emitting elements may define a unit light emitting element, and two of the photosensitive elements may be arranged to correspond to the unit light emitting element.

The light emitting element may include first color light emitting elements, second color light emitting elements, and third color light emitting elements. The photosensitive element may be arranged at a center of an area defined by one first color light emitting element of the first color light emitting elements, two second color light emitting elements of the second color light emitting elements, and one third color light emitting element of the third color light emitting elements.

The distance between the first line portion and the edge of the first opening may be greater than a line width of the first line portion.

The distance between the first line portion and the edge of the first opening may be greater by a line width of the first line portion or more than the distance between the first line portion and the edge of the second opening.

Another embodiment of the present disclosure provides a display device including: a display panel including: a base layer; first to third light emitting elements on the base layer; a photosensitive element on the base layer; and a thin-film encapsulation layer covering the first to third light emitting elements and the photosensitive element; an input sensor including a sensing electrode on the display panel; and an anti-reflection layer on the input sensor. The anti-reflection layer includes: a light shielding pattern having first to third openings respectively corresponding to the first to third light emitting elements and a fourth opening corresponding to the photosensitive element; and a color filter. The sensing electrode includes a plurality of line portions defining first to fourth electrode openings respectively corresponding to the first to fourth openings. The plurality of line portions includes a first line portion defining the first to third openings and the fourth opening in common and second line portions defining two adjacent openings from among the first to third openings in common, and the first line portion is nearer to an edge of the fourth opening than to edges of the first to third openings on a plane.

Each of the second line portions may be spaced apart by a same distance from edges of two corresponding ones of the openings on the plane.

Another embodiment of the present disclosure provides a display device including: a display panel including: a base layer; a light emitting element on the base layer; a photosensitive element on the base layer; and a thin-film encapsulation layer covering the light emitting element and the photosensitive element; an input sensor including a sensing electrode on the display panel; and an anti-reflection layer on the input sensor. The anti-reflection layer includes: a light shielding pattern having a first opening corresponding to the light emitting element and a second opening corresponding to the photosensitive element; and a color filter. The sensing electrode includes a plurality of line portions, and the plurality of line portions includes a first line portion overlapping the light shielding pattern and the photosensitive element on a plane.

The light emitting element may include a first color light emitting element, a second color light emitting element, and a third color light emitting element, and the first opening may have a first color opening corresponding to the first color light emitting element, a second color opening corresponding to the second color light emitting element, and a third color opening corresponding to the third color light emitting element.

The plurality of line portions may further include: a second line portion overlapping the light shielding pattern and arranged between the first color opening and the second color opening on the plane; and a third line portion overlapping the light shielding pattern and arranged between the second color opening and the third color opening on the plane. On the plane, the second line portion may not overlap the first color light emitting element and the second color light emitting element, and the third line portion may not overlap the second color light emitting element and the third color light emitting element.

A difference between a distance between the second line portion and an edge of the first color opening and a distance between the second line portion and an edge of the second color opening may be equal to or less than 0.1 µm, and a difference between a distance between the third line portion and an edge of the second color opening and a distance between the third line portion and an edge of the third color opening may be equal to or less than 0.1 µm.

The color filter may overlap the light emitting element and the photosensitive element.

The light shielding pattern may overlap the photosensitive element on the plane.

BRIEF DESCRIPTION OF THE DRAWINGS

The accompanying drawings are included to provide a further understanding of the present disclosure and are incorporated in and constitute a part of this specification. The drawings illustrate embodiments of the present disclosure and, together with the description, describe aspects and features of the present disclosure. In the drawings:

FIG. 5A is a plan view illustrating a connection relationship between a photosensitive element and a sensor driving circuit according to an embodiment of the present disclosure;

FIG. 6A is a circuit diagram representing a pixel and a sensor according to an embodiment of the present disclosure;

FIG. 6B is a waveform diagram for describing operations of the pixel and the sensor illustrated in FIG. 6A;

FIG. 11A is a plan view illustrating an input sensor according to an embodiment of the present disclosure;

DETAILED DESCRIPTION

Figure 1:
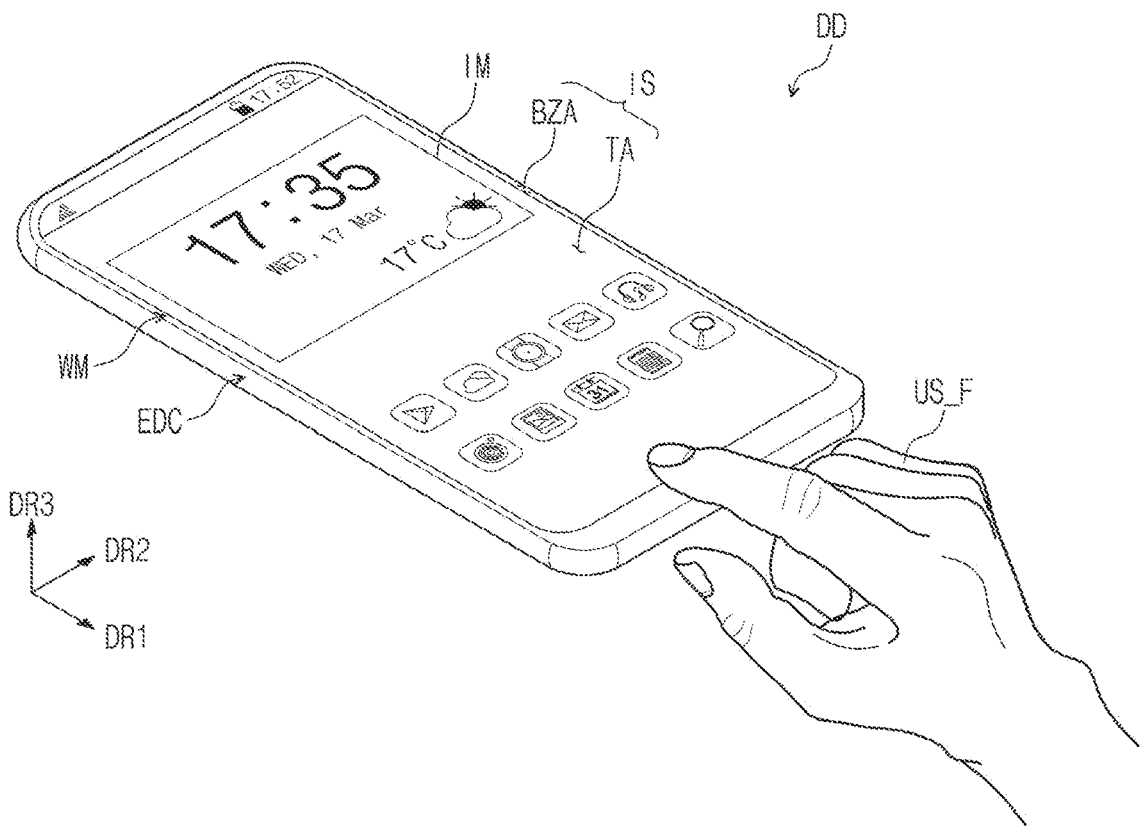
FIG. 1 is a perspective view illustrating a display device according to an embodiment of the present disclosure.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

In the figures, dimensions of the various elements, layers, etc. may be exaggerated for clarity of illustration. The same reference numerals designate the same elements. As used herein, the term "and/or" includes any and all combinations of one or more of the associated listed items. Further, the use of "may" when describing embodiments of the present disclosure relates to "one or more embodiments of the present disclosure." Expressions, such as "at least one of," when preceding a list of elements, modify the entire list of elements and do not modify the individual elements of the list. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing embodiments of the present disclosure and is not intended to be limiting of the present disclosure. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

Hereinafter, embodiments of the present disclosure will be described with reference to the accompanying drawings.

Figure 2:
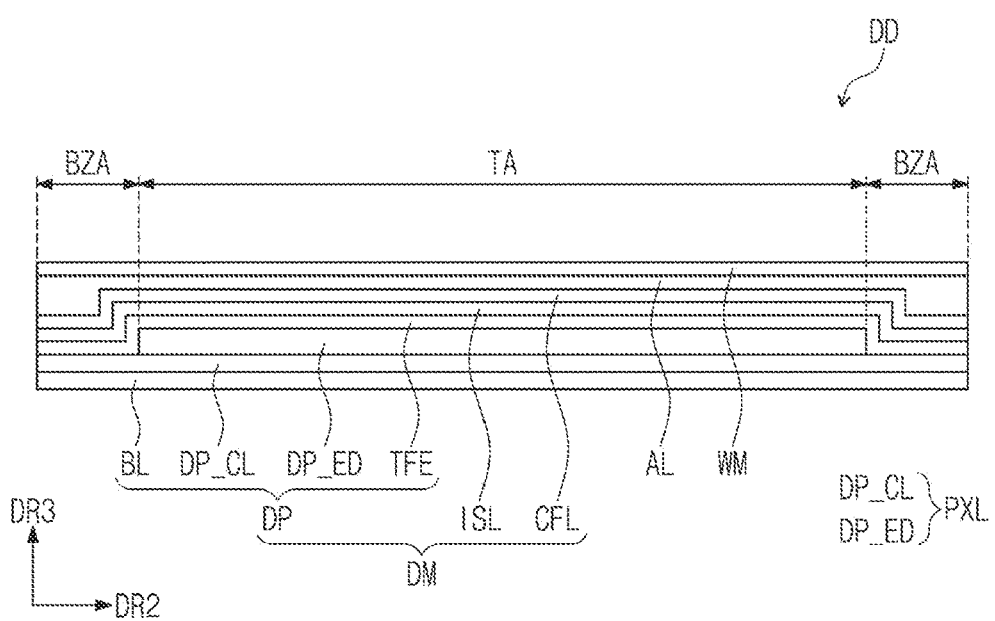
FIG. 2 is a cross-sectional view illustrating the display device according to an embodiment of the present disclosure.

FIG. 1 is a perspective view illustrating a display device according to an embodiment of the present disclosure, and FIG. 2 is a cross-sectional view of the display device shown in FIG. 1.

Referring to FIGS. 1 and 2, a display device DD according to an embodiment of the present disclosure may have a rectangular shape having long sides parallel to a first direction DR1 and short sides parallel to a second direction DR2 crossing the first direction DR1. However, the present disclosure is not limited thereto. For example, the display device DD may have various shapes, such as a circular shape or a polygonal shape.

The display device DD may be activated by an electrical signal. The display device DD may include various embodiments. For example, the display device DD may be applied to electronic devices, such as a smart watch, a tablet computer, a notebook computer, a personal computer, and a smart television.

Hereinafter, a normal direction that is substantially perpendicular to a plane defined by the first and second directions DR1 and DR2 is defined as a third direction DR3. In this specification, an expression "when viewed on a plane" may represent a state when viewed in the third direction DR3.

The display device DD may have a top surface defined as a display surface IS and parallel to the plane defined by the first and second directions DR1 and DR2. Images IM generated in the display device DD may be provided to a user through the display surface IS.

The display surface IS may be divided into a transmission area TA and a bezel area BZA. The transmission area TA may be an area at where the images IM are displayed. The user may recognize the images IM through the transmission area TA. In the illustrated embodiment, the transmission area TA has a rectangular shape with rounded vertices. However, this is merely illustrative, and the present disclosure is not limited thereto. For example, the transmission area TA may have various shapes.

The bezel area BZA is adjacent to the transmission area TA. The bezel area BZA may have a color (e.g., a predetermined color). The bezel area BZA may surround (e.g., may surround in a plan view or extend around a periphery of) the transmission area TA. Thus, the transmission area TA may have a shape that is substantially defined by the bezel area BA. However, this is merely illustrative. For example, the bezel area BZA may be disposed adjacent to only one side of the transmission area TA or may be omitted.

The display device DD may sense an external input applied from the outside. The external input may include various types of inputs provided from the outside of the display device DD. For example, the external input may include contact caused by a portion of a body, such as a hand US_F of the user, or contact caused by a separate device (e.g., an active pen or a digitizer) and an external input applied when a portion of a body or device approach the display device DD or are adjacent within a distance (e.g., a predetermined distance) to the display device DD (e.g., hovering). Also, the external input may have various types of inputs, such as force, pressure, temperature, and light.

The display device DD may sense biometric information of the user applied from the outside. A biometric information sensing area configured for sensing the biometric information of the user may be provided on the display surface IS of the display device DD. The biometric information sensing area may be provided at an entire area or a partial area of the transmission area TA. In FIG. 1, the entire transmission area TA is used as the biometric information sensing area according to an embodiment of the present disclosure.

The display device DD includes a window WM, a display module DM, and a housing EDC. In the illustrated embodiment, the window WN and the housing EDC are coupled to provide an external appearance of the display device DD.

The window WM has a front surface that defines the display surface IS of the display device DD. The window WM may include an optically clear insulating material. For example, the window WM may include glass or plastic. The window WM may have a multi-layer structure or a single-layer structure. For example, the window WM may include a plurality of plastic films coupled by an adhesive or a glass substrate and a plastic film that are coupled by an adhesive.

The display module DM may include a display panel DP and an input sensor ISL. The display panel DP may display an image according to an electrical signal, and the input sensor ISL may sense an external input applied from the outside. The external input may include various types of inputs.

Although the display panel DP according to an embodiment of the present disclosure may be a light emitting display panel, the present disclosure is not limited thereto. For example, the display panel DP may be an organic light emitting display panel or an inorganic light emitting display panel. The organic light emitting display panel may include a light emitting layer containing an organic light emitting material, and the inorganic light emitting display panel may include a light emitting layer containing an inorganic light emitting material (e.g., a quantum dot or a quantum rod). Hereinafter, the display panel DP will be described as being the organic light emitting display panel.

Referring to FIG. 2, the display panel DP includes a base layer BL, a pixel layer PXL, and a thin-film encapsulation layer TFE. The display panel DP according to an embodiment of the present disclosure may be a flexible display panel. However, the present disclosure is not limited thereto. For example, the display panel DP may be a foldable display panel that is folded along a folding axis or may be a rigid display panel.

The base layer BL may include a synthetic resin layer. The synthetic resin layer may be a polyimide-based resin layer, but the present disclosure is not limited thereto. In addition, the base layer BL may include a glass substrate, a metal substrate, or an organic/inorganic composite substrate.

The pixel layer PXL is disposed on the base layer BL. The pixel layer PXL may include a circuit layer DP_CL and an element layer DP_ED. The circuit layer DP_CL is disposed between the base layer BL and the element layer DP_ED. The circuit layer DP_CL includes an insulation layer and a circuit element. Hereinafter, the insulation layer of the circuit layer DP-CL is referred to as an intermediate insulation layer. The intermediate insulation layer includes at least one intermediate inorganic layer and at least one intermediate organic layer. The circuit element may include a pixel driving circuit in each of a plurality of pixels for displaying an image and a sensor driving circuit in each of a plurality of pixels for recognizing external information. The external information may be biometric information. The sensor may be a fingerprint recognition sensor, a proximity sensor, and an iris recognition sensor according to various embodiments of the present disclosure. Also, the sensor may be an optical sensor that recognizes biometric information in an optical manner. The circuit layer DP_CL may include signal lines connected to the pixel driving circuit and/or the sensor driving circuit.

The element layer DP_ED may include a light emitting element in each of the pixels and a photosensitive element in each of the pixels. The photosensitive element may be a photodiode, but the present disclosure is not limited thereto. The photosensitive element may be a sensor that senses light reflected by a fingerprint of the user or a sensor that responds to light. A detailed description on the circuit layer DP_CL and the element layer DP_ED is provided below.

The thin-film encapsulation layer TFE seals the element layer DP_ED. The encapsulation layer TFE may include at least one organic layer and at least one inorganic layer. The inorganic layer may include an inorganic material and may protect the element layer EP_ED from moisture or oxygen. The inorganic layer may include a silicon nitride layer, a silicon oxynitride layer, a silicon oxide layer, a titanium oxide layer, or an aluminum oxide layer, but the present disclosure is not limited thereto. The organic layer may include an organic material and may protect the element layer DP_ED from foreign substances, such as dust particles. The thin-film encapsulation layer TFE may include an inorganic layer, an organic layer, and an inorganic layer, which are sequentially laminated with each other.

The input sensor ISL may be disposed on the display panel DP. The input sensor ISL may be directly disposed on the thin film encapsulation layer TFE. According to an embodiment of the present disclosure, the input sensor ISL may be provided on the display panel DP through a continuous process. For example, an adhesive layer may not be provided between the input sensor ISL and the display panel DP.

The input sensor ISL may sense an external input (e.g., a touch of the user), may convert the sensed external input into an input signal (e.g., a predetermined input signal), and may provide the input signal to the display panel DP. The input sensor ISL may include a plurality of sensing electrodes for sensing an external input. The sensing electrodes may sense an external input in a mutual capacitance method or in a self-capacitance method. The display panel DP may receive an input signal from the input sensor ISL and may generate an image corresponding to the input signal.

The display module DM may further include an anti-reflection layer CFL. The anti-reflection layer CFL may be disposed on the input sensor ISL, but the present disclosure is not limited thereto. The anti-reflection layer CFL may include a plurality of color filters and a light shielding pattern. A detailed description on the input sensor ISL and the anti-reflection layer CFL is provided below.

The display device DD according to an embodiment of the present disclosure may further include an adhesive layer AL. The window WM may be attached to the input sensor ISL by the adhesive layer AL. The adhesive layer AL may include an optically clear adhesive (OCA), an optically clear adhesive resin, or a pressure sensitive adhesive (PSA).

The housing EDC is coupled with the window WM. The housing EDC is coupled with the window WM to provide an inner space (e.g., a predetermined inner space). The display module DM may be accommodated in the inner space. The housing EDC may include a material having relatively high rigidity. For example, the housing EDC may include a plurality of frames and/or plates made of glass, plastic, metal, or a combination thereof. The housing EDC may stably protect components of the display device DD accommodated in the inner space from an external impact. A battery module or the like for supplying power for overall operation of the display device DD may be disposed between the display module DM and the housing EDC.

Figure 3:
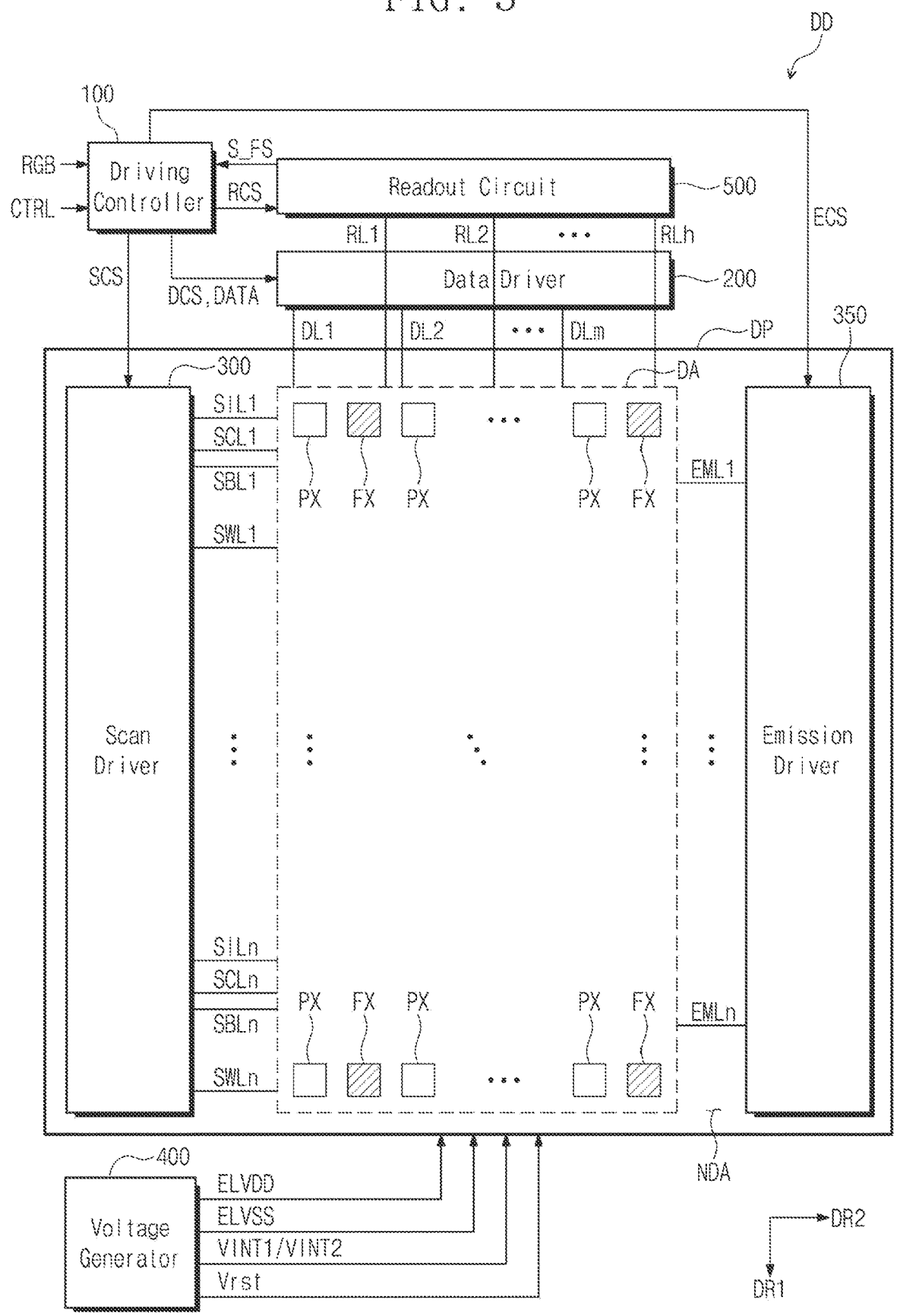
FIG. 3 is a block diagram representing the display device according to an embodiment of the present disclosure.

FIG. 3 is a block diagram representing the display device DD according to an embodiment of the present disclosure.

Referring to FIG. 3, the display device DD includes a display panel DP, a driving controller 100, and a driving circuit. In an embodiment of the present disclosure, the driving circuit includes a data driver 200, a scan driver 300, an emission driver 350, a voltage generator 400, and a readout circuit (e.g., a readout driver) 500. In an embodiment of the present disclosure, the voltage generator 400 and the readout circuit 500 may be provided in one driving chip with the driving controller 100.

The driving controller 100 receives an image signal RGB and a control signal CTRL. The driving controller 100 generates an image data signal DATA by converting a data format of the image signal RGB appropriately to an interface specification with the data driver 200. The driving controller 100 outputs a first control signal SCS, a second control signal ECS, a third control signal DCS, and a fourth control signal RCS.

The data driver 200 receives the third control signal DCS and the image data signal DATA from the driving controller 100. The data driver 200 converts the image data signal DATA into data signals and outputs the data signals to a plurality of data lines DL1 to DLm, which are described below. The data signals are analog voltages corresponding to a gradation value of the image data signal DATA.

The scan driver 300 receives the first control signal SCS from the driving controller 100. The scan driver 300 may output the scan signals to scan lines in response to the first control signal SCS.

The voltage generator 400 generates voltages for operation of the display panel DP. In the illustrated embodiment, the voltage generator 400 generates a first driving voltage ELVDD, a second driving voltage ELVSS, a first initialization voltage VINT1, and a second initialization voltage VINT2.

The display panel DP may have a display area DA corresponding to the transmission area TA (see, e.g., FIG. 1) and a non-display area NDA corresponding to the bezel area BZA (see, e.g., FIG. 1).

The display panel DP may include a plurality of pixels PX disposed in the display area DA and a plurality of sensors FX disposed in the display area DA. In an embodiment of the present disclosure, each of the plurality of sensors FX may be disposed between two pixels PX adjacent to each other. The plurality of pixels PX and the plurality of sensors FX may be alternately arranged in the first and second directions DR1 and DR2, but the present disclosure is not limited thereto. For example, two or more pixels PX may be disposed between two adjacent sensors FX in the first direction DR1 from among the plurality of sensors FX, or two or more pixels PX may be disposed between two adjacent sensors FX in the second direction DR2 from among the plurality of sensors FX.

The display panel DP further includes initialization scan lines SIL1 to SILn, compensation scan lines SCL1 to SCLn, write scan lines SWL1 to SWLn, black scan lines SBL1 to SBLn, emission control lines EML1 to EMLn, and readout lines RL1 to RLh. Each of the initialization scan lines SIL1 to SILn, the compensation scan lines SCL1 to SCLn, the write scan lines SWL1 to SWLn, the black scan lines SBL1 to SBLn, and the emission control lines EML1 to EMLn extends in the second direction DR2. The initialization scan lines SIL1 to SILn, the compensation scan lines SCL1 to SCLn, the write scan lines SWL1 to SWLn, the black scan lines SBL1 to SBLn, and the emission control lines EML1 to EMLn are spaced apart from each other in the first direction DR1. The data lines DL1 to DLm and the readout lines RL1 to RLh each extend in the first direction DR1 and are spaced apart from each other in the second direction DR2.

The plurality of pixels PX are electrically connected to the initialization scan lines SIL1 to SILn, the compensation scan lines SCL1 to SCLn, the write scan lines SWL1 to SWLn, the black scan lines SBL1 to SBLn, the emission control lines EML1 to EMLn, and the data lines DL1 to DLm, respectively. For example, each of the plurality of pixels PX is electrically connected to four scan lines. However, the number of the scan lines connected to each of the pixels PX is not limited. For example, the number of the scan lines connected to each of the pixels PX may be varied.

The plurality of sensors FX may be electrically connected to the write scan lines SWL1 to SWLn and the readout lines RL1 to RLh, respectively. Each of the plurality of sensors FX may be electrically connected to one scan line, but the present disclosure is not limited thereto. For example, the number of the scan lines connected to each of the sensors FX may be varied. In an embodiment of the present disclosure, the number of the readout lines RL1 to RLh may be a half of the number of the data lines DL1 to DLm. However, the present disclosure is not limited thereto. In another embodiment, the number of the readout lines RL1 to RLh may be one fourth or one eighth of the number of the data lines DL1 to DLm.

The scan driver 300 may be disposed in the non-display area NDA of the display panel DP. The scan driver 300 receives the first control signal SCS from the driving controller 100. The scan driver 300 outputs initialization scan signals to the initialization scan lines SIL1 to SILn and compensation scan signals to the compensation scan lines SCL1 to SCLn in response to the first control signal SCS. Also, the scan driver 300 may output write scan signals to the write scan lines SWL1 to SWLn and black scan signals to the black scan lines SBL1 to SBLn in response to the first control signal SCS. In some embodiments, the scan driver 300 may include first and second scan drivers. The first scan driver may output the initialization scan signals and the compensation scan signals, and the second scan driver may output the write scan signals and the black scan signals.

The emission driver 350 may be disposed in the non-display area NDA of the display panel DP. The emission driver 350 receives the second control signal ECS from the driving controller 100. The emission driver 350 may output emission control signals to the emission control lines EML1 to EMLn in response to the second control signal ECS. In other embodiments, the scan driver 300 may be connected to the emission control lines EML1 to EMLn. In such an embodiment, the emission driver 350 may be omitted, and the scan driver 300 may output the emission control signals to the emission control lines EML1 to EMLn.

The readout driver 500 receives the fourth control signal RCS from the driving controller 100. The readout driver 500 may receive sensing signals from the readout lines RL1 to RLh in response to the fourth control signal RCS. The readout driver 500 may process the sensing signals received from the readout lines RL1 to RLh and provide processed sensing signals S_FS to the driving controller 100. The driving controller 100 may recognize biometric information based on the sensing signals S_FS.

Figure 4:
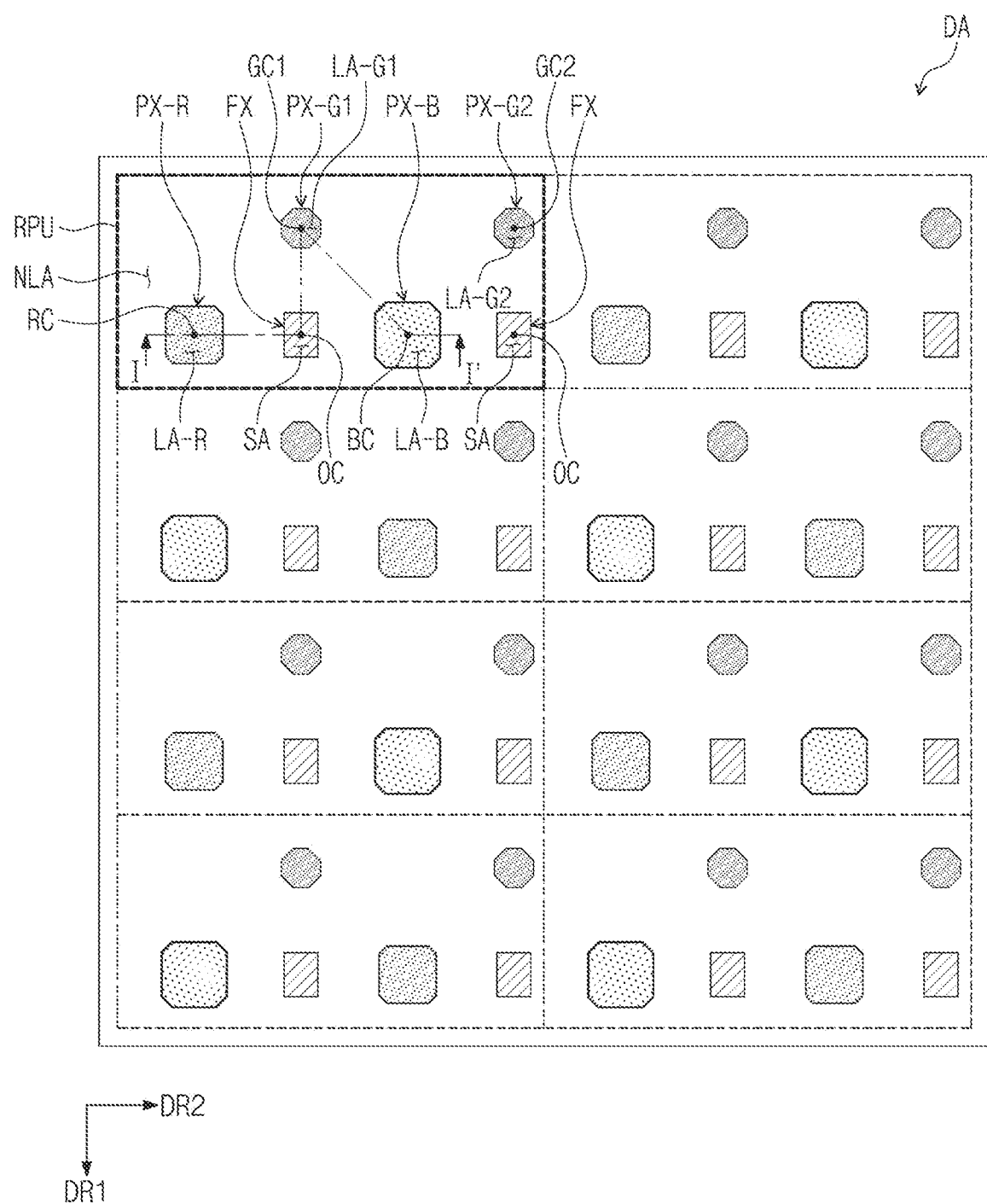
FIG. 4 is an enlarged plan view illustrating a partial area of a display panel according to an embodiment of the present disclosure.

FIG. 4 is an enlarged plan view illustrating a partial area of the display area DA according to an embodiment of the present disclosure.

In FIG. 4, unit areas RPU that are repeatedly arranged on the display area DA are distinguished and illustrated. A unit pixel and at least one sensor FX are disposed in each of the unit areas RPU. The unit pixel may be defined as a group of repeated pixels from among the plurality of pixels PX shown in FIG. 3.

The unit pixel may include a first color pixel PX-R, two second color pixels PX-G1 and PX-G2, and a third color pixel PX-B. In the illustrated embodiment, a first color may be red, a second color may be green, and a third color may be blue. In the illustrated embodiment, two sensors FX may be disposed in each of the unit areas RPU. The first color pixel PX-R includes a first color light emitting element, each of the two second color pixels PX-G1 and PX-G2 includes a second color light emitting element, and the third color pixel PX-B include a third color light emitting element.

In FIG. 4, a first light emitting area LA-R of the first color light emitting element, second light emitting areas LA-G1 and LA-G2 of the second color light emitting elements, and a third light emitting area LA-B of the third color light emitting element are illustrated. From among the first light emitting area LA-R, the second light emitting areas LA-G1 and LA-G2, and the third light emitting area LA-B, the third light emitting area LA-B may have a largest surface area, and each of the second light emitting areas LA-G1 and LA-G2 may have a smallest surface area. Also, a sensing area SA of a photosensitive element of each of the two sensors FX is illustrated. One first color light emitting element, two second color light emitting element, and one third color light emitting element may define a unit light emitting element, and one first light emitting area LA-R, two second light emitting areas LA-G1 and LA-G2, and one third light emitting area LA-B may define a unit light emitting area.

The unit areas RPU arranged in the second direction DR2 may have the same pixel arrangement, and the unit areas RPU arranged in the first direction DR1 may have different positions of the first color pixel PX-R and the third color pixel PX-B. Among the unit areas RPU, first-type unit areas and second-type unit areas may be alternately arranged in the first direction DR1.

Referring to each of the unit areas RPU, the second light emitting areas LA-G1 and LA-G2 are aligned in the second direction DR2. Central points GC1 and GC2 of the second light emitting areas LA-G1 and LA-G2 are aligned in the second direction DR2. Each of the sensing areas SA is aligned to the corresponding second light emitting area LA-G1 or LA-G2 from among the second light emitting areas LA-G1 and LA-G2 in the first direction DR1. Central points OC of the sensing areas SA are respectively aligned with the central points GC1 and GC2 of the second light emitting areas LA-G1 and LA-G2 in the first direction DR1.

The first light emitting area LA-R, the third light emitting area LA-B, and the sensing areas SA are aligned in the second direction DR2. A central point RC of the first light emitting area LA-R, a central point BC of the third light emitting area LA-B, and a central point OC of each of the sensing areas SA are aligned in the second direction DR2. One sensing area SA is disposed between the first light emitting area LA-R and the third light emitting area LA-B, and the first light emitting area LA-R and the third light emitting area LA-B are disposed between two sensing areas SA.

Referring to FIG. 4, each of the sensing areas SA is disposed at a central portion of an area defined by the first light emitting area LA-R, the third light emitting area LA-B, and two second light emitting areas LA-G1 and LA-G2 regardless of distinguishment of the unit areas RPU. Each of the sensing areas SA is disposed between the first light emitting area LA-R and the third light emitting area LA-B in the second direction DR2 and between the two second light emitting areas LA-G1 and LA-G2 in the first direction DR1.

Figure 5B:
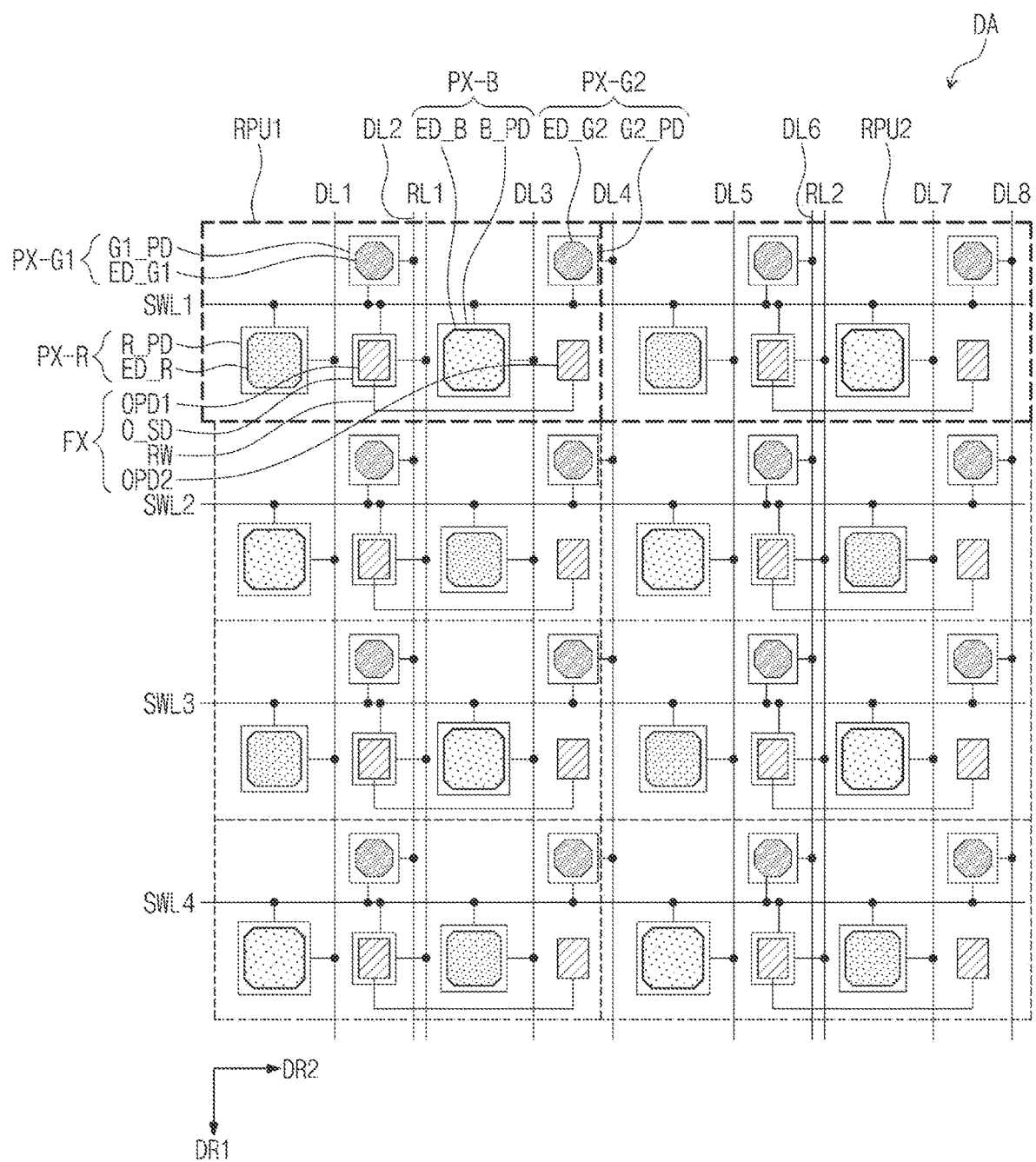
FIG. 5B is a circuit diagram illustrating the connection relationship between the photosensitive element and the sensor driving circuit in FIG. 5A.
Figure 5C:
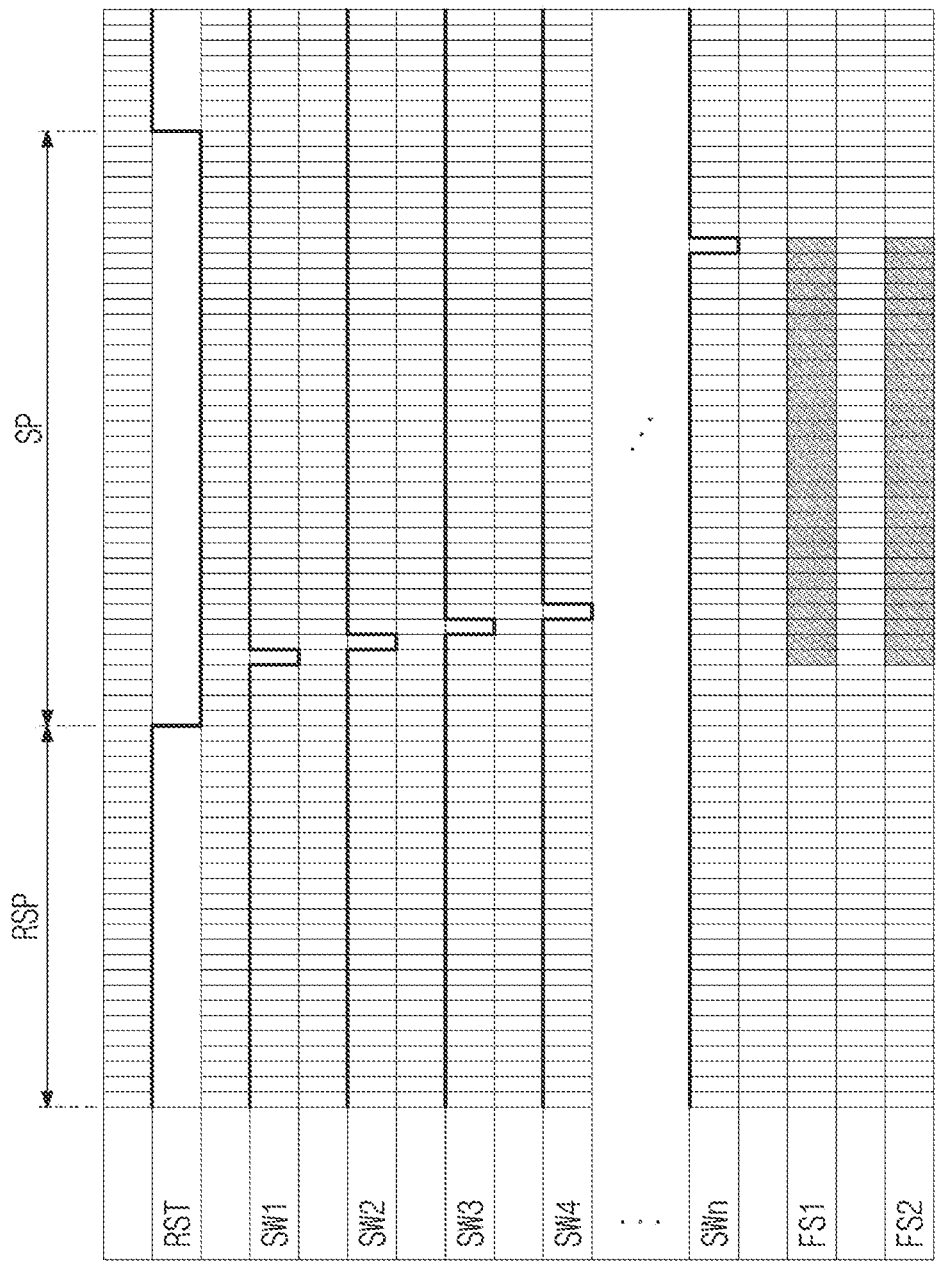
FIG. 5C represents a readout timing of sensors in FIG. 5B according to an embodiment of the present disclosure.

FIG. 5A is a plan view illustrating a connection relationship between the light emitting element and the pixel driving circuit and a connection relationship between the photosensitive element and the sensor driving circuit according to an embodiment of the present disclosure. FIG. 5B is a circuit diagram illustrating the connection relationship between the light emitting element and the pixel driving circuit and the connection relationship between the photosensitive element and the sensor driving circuit in FIG. 5A. FIG. 5C illustrates readout timing of the sensors FX shown in FIG. 5B according to an embodiment of the present disclosure.

Hereinafter, the first color pixel PX-R is defined as a red pixel, the second color pixels PX-G1 and PX-G2 is defined as a green pixel, and the third color pixel PX-B is defined as a blue pixel. Also, the first color light emitting element is defined as a red light emitting element ED_R, the second color light emitting element is defined as a green light emitting element ED_G, and the third color light emitting element is defined as a blue light emitting element ED_B. Also, the first light emitting area LA-R, the second light emitting area LA-G1, and the third light emitting area LA-B are defined as a red light emitting area LA-R, a green light emitting area LA-G, and a blue light emitting area LA-B.

Referring to FIG. 5A, a first electrode R_AE and a light emitting layer R_EL of the red light emitting element ED_R are illustrated in correspondence to the red light emitting area LA-R in FIG. 4. A first electrode G1_AE and a light emitting layer G1_EL of the first green light emitting element ED_G1 are illustrated in correspondence to one of the second light emitting areas LA-G1 and LA-G2, and a first electrode G2_AE and a light emitting layer G2_EL of the second green light emitting element ED_G2 are illustrated in correspondence to the other of the second light emitting areas LA-G1 and LA-G2. A first electrode B_AE and a light emitting layer B_EL of the blue light emitting element ED_B are illustrated in correspondence to the third light emitting areas LA-B. A first electrode O_AE1 and a photoelectric conversion layer O_RL1 of a first photosensitive element OPD1 are illustrated in correspondence to one of the two sensing areas SA in the unit area RPU, and a first electrode O_AE2 and a photoelectric conversion layer O_RL2 of a second photosensitive element OPD2 are illustrated in correspondence to the other of the two sensing areas SA.

A pixel driving circuit R_PD of the red pixel PX-R, a pixel driving circuit G1_PD of the first green pixel PX-G1, a pixel driving circuit G2_PD of the second green pixel PX-G2, a pixel driving circuit B_PD of the blue pixel PX-B, and a sensor driving circuit O_SD are disposed in the unit area RPU.

The first electrode R_AE, G1_AE, G2_AE, and B_AE of the light emitting elements ED_R, ED_G1, ED_G2, and ED_B are electrically connected to the pixel driving circuits R_PD, G1_PD, G2_PD, and B_PD, respectively. For example, the red light emitting element ED_R is electrically connected to the pixel driving circuit R-PD thereof. In more detail, the first electrode R_AE of the red light emitting element ED_R is connected to the corresponding pixel driving circuit R_PD through a contact hole (e.g., a contact opening).

The sensor FX include a first photosensitive element OPD1, a second photosensitive element OPD2, and a sensor driving circuit O_SD. In such an embodiment, all of the first photosensitive element OPD1 and the second photosensitive element OPD2 may be electrically connected to one sensor driving circuit O_SD. The sensor FX may further include a routing line RW for electrically connecting the first and second photosensitive elements OPD1 and OPD2. The first electrode O_AE1 of the first photosensitive element OPD1 may be connected to the first electrode O_AE2 of the second photosensitive element OPD2 via the routing line RW, and the first electrode O_AE1 of the first photosensitive element OPD1 may be connected to the sensor driving circuit O_SD through a contact hole (e.g., a contact opening). In other embodiments, the first photosensitive element OPD1 and the second photosensitive element OPD2 may be connected to different sensor driving circuits O_SD. In such an embodiment, two sensors FX are disposed in one unit area RPU.

FIG. 5B schematically illustrates a connection relationship of the pixels PX-R, PX-G1, PX-G2, and PX-B and the sensor FX to the write scan lines SWL1 to SWLn, the readout lines RL1 and RL2, and the data lines DL1 to DL8. Hereinafter, a first unit area RPU1 and a second unit area RPU2, which are arranged in the second direction DR2, will be primarily described.

Four scan lines (e.g., the write scan line, the compensation scan line, the initialization scan line, and the black scan line) are connected to each of the pixels PX-R, PX-G1, PX-G2, and PX-B. In FIG. 5B, only one (e.g., the write scan line) of the four scan lines is illustrated for convenience of description.

In FIG. 5B, four write scan lines SWL1 to SWL4 of the plurality of write scan lines SWL1 to SWLn (see, e.g., FIG. 3), eight data lines DL1 to DL8 of the plurality of data lines DL1 to DLm (see, e.g., FIG. 3), and two readout lines RL1 and RL2 of the plurality of readout lines RL1 to RLh (see, e.g., FIG. 3) are illustrated.

The first write scan line SWL1 and the first to fourth data lines DL1 to DL4 may be connected to the pixels PX-R, PX-G1, PX-G2, and PX-B arranged on the first unit area RPU1. The first write scan line SWL1 and the fifth to eighth data lines DL5 to DL8 may be connected to the pixels PX-R, PX-G1, PX-G2, and PX-B arranged on the second unit area RPU2. The first write scan line SWL1 and the first readout line RL1 are connected to the sensor FX disposed on the first unit area RPU1, and the first write scan line SWL1 and the second readout line RL2 are connected to the sensor FX disposed on the second unit area RPU2.

Referring to FIGS. 5B and 5C, the sensor driving circuit O_SC may respectively output first and second sensing signal FS1 and FS2 to the first and second readout lines RL1 and RL2 during an activation period of the write scan signals SW1 to SW4 applied to the corresponding write scan lines SWL1 to SWL4. A period in which the first and second sensing signals FS1 and FS2 are output may be defined as a sensing period SP. A period in which the sensor driving circuit O_SD is reset prior to the sensing period SP is defined as a reset period RSP. The reset period RSP and the sensing period SP may be alternately repeated. According to an embodiment of the present disclosure, a plurality of sensing periods SP may occur between two reset periods RSP.

FIG. 6A is a circuit diagram representing the pixel PX-R and the sensor FX according to an embodiment of the present disclosure, and FIG. 6B is a waveform diagram for describing operations of the pixel PX-R and the sensor FX illustrated in FIG. 6A.

In FIG. 6A, an equivalent circuit diagram of the red pixel PX-R from among the plurality of pixels PX is illustrated as an example. Because each of the plurality of pixels PX has the same circuit structure, a circuit structure of the red pixel PX-R will be described and detailed descriptions of the remainder of the pixels will be omitted. Also, an equivalent circuit diagram of one sensor FX from among the plurality of sensors FX illustrated in FIG. 3 is illustrated as an example in FIG. 6A. Because each of the plurality of sensors FX has the same circuit structure, a circuit structure of one sensor FX will be described, and detailed descriptions for the remainder of the sensors FX will be omitted.

Referring to FIG. 6A, the red pixel PX-R is connected to a i-th data line DLi, a j-th initialization scan line SILj, a j-th compensation scan line SCLj, a j-th write scan line SWLj, a j-th black scan line SBLj, and a j-th emission control line EMLj.

The pixel driving circuit R_PD include first to fifth transistors T1, T2, T3, T4, and T5, first and second emission control transistors ET1 and ET2, and one capacitor Cst. At least one of the first to fifth transistors T1, T2, T3, T4, and T5 and the first and second emission control transistors ET1 and ET2 may be a transistor having a low-temperature polycrystalline silicon (LTPS) semiconductor layer. A portion of (e.g., some of) the first to fifth transistors T1, T2, T3, T4, and T5 and the first and second emission control transistors ET1 and ET2 may be p-type transistors, and the remainder may be n-type transistors. For example, each of the first, second, and fifth transistors T1, T2, and T5 and the first and second emission control transistors ET1 and ET2 may be a PMOS transistor, and each of the third and fourth transistors T3 and T4 may be a NMOS transistor. Hereinafter, a source, a drain, and a gate of each of the first, second, and fifth transistors T1, T2, and T5 and the first and second emission control transistors ET1 and ET2 will be described based on them being PMOS transistors, and a source, a drain, and a gate of each of the third and fourth transistors T3 and T4 will be described based on them being NMOS transistors.

At least one of the first to fifth transistors T1, T2, T3, T4, and T5 and the first and second emission control transistors ET1 and ET2 may be a transistor having an oxide semiconductor layer. For example, each of the third and fourth transistors T3 and T4 may be an oxide semiconductor transistor, and each of the first, second, and fifth transistors T1, T2, and T5 and the first and second emission control transistors ET1 and ET2 may be a silicon transistor.

However, the configuration of the pixel driving circuit R_PD according to the present disclosure is not limited to the embodiment shown in FIG. 6A. The pixel driving circuit R_PD illustrated in FIG. 6A is merely illustrative, and the pixel driving circuit R_PD may have various configurations. For example, all of the first to fifth transistors T1, T2, T3, T4, and T5 and the first and second emission control transistors ET1 and ET2 may be p-type transistors or n-type transistors.

The j-th initialization scan line SILj, the j-th compensation scan line SCLj, the j-th write scan line SWLj, the j-th black scan line SBLj, and the j-th emission control line EMLj may respectively transmit a j-th initialization scan signal SIj, a j-th compensation scan signal SCj, a j-th write scan signal SWj, a j-th black scan signal SBj, and a j-th emission control signal EMj to the red pixel PX-R. The i-th data line DLi transmits a i-th data signal Di to the red pixel PX-R. The i-th data signal Di may have a voltage level corresponding to the image signal RGB (see, e.g., FIG. 3) inputted to the display device DD (see, e.g., FIG. 3).

First and second driving voltage lines VL1 and VL2 may respectively transmit a first driving voltage ELVDD and a second driving voltage ELVSS to the red pixel PX-R. Also, first and second initialization voltage lines VL3 and VL4 may respectively transmit a first initialization voltage VINT1 and a second initialization voltage VINT2 to the red pixel PX-R.

The first transistor T1 may be connected between the first driving voltage line VL1 receiving the first driving voltage ELVDD and the red light emitting element ED_R. The first transistor T1 includes a source connected with the first driving voltage line VL1 through the first emission control transistor ET1, a drain connected with the first electrode R_AE (see, e.g., FIG. 5A) of the red light emitting element ED_R through the second emission control transistor ET2, and a gate connected with one end (e.g., a first node N1) of the capacitor Cst. The first transistor T1 may receive the i-th data signal Di transmitted by the i-th data line DLi and may supply a driving current Id to the red light emitting element ED_R according to a switching operation of the second transistor T2.

The second transistor T2 is connected between the data line DLi and the source of the first transistor T1. The second transistor T2 include a source connected with the data line DLi, a drain connected with the source of the first transistor T1, and a gate connected with the j-th write scan line SWLj. The second transistor T2 may be turned on according to the write scan signal SWj received through the j-th write scan line SWLj and may transmit the i-th data signal Di transmitted from the i-th data line DLi to the source of the first transistor T1.

The third transistor T3 is connected between the drain of the first transistor T1 and the first node N1. The third transistor T3 includes a source connected with the gate of the first transistor T1, a drain connected with the drain of the first transistor T1, and a gate connected with the j-th compensation scan line SCLj. The third transistor T3 may be turned on according to the j-th compensation scan signal SCj received through the j-th compensation scan line SCLj and may connect the drain and the gate of the first transistor T1 so that the first transistor T1 is diode-connected.

The fourth transistor T4 is connected between the first initialization voltage line VL3 to which the first initialization voltage VINT1 is applied and the first node N1. The fourth transistor T4 includes a source connected with the first initialization voltage line VL3 to which the first initialization voltage VINT1 is transmitted, a drain connected with the first node N1, and a gate connected with the j-th initialization scan line SILj. The fourth transistor T4 is turned on according to the j-th initialization scan signal Slj received through the j-th initialization scan line SILj. The turned-on fourth transistor T4 transmits the first initialization voltage VINT1 to the first node N1 and may initialize a potential (e.g., potential of the first node N1) of the gate of the first transistor T1.

The first emission control transistor ET1 includes a source connected with the first driving voltage line VL1, a drain connected with the source of the first transistor T1, and a gate connected with the j-th emission control line EMLj. The second emission control transistor ET2 includes a source connected with the drain of the first transistor T1, a drain connected with the first electrode R_AE (see, e.g., FIG. 5A) of the red light emitting element ED_R, and a gate connected with the j-th emission control line EMLj The first and second emission control transistors ET1 and ET2 are turned on at the same time according to the j-th emission control signal EMj transmitted through the j-th emission control line EMLj. The first driving voltage ELVDD applied through the turned-on first emission control transistor ET1 may be compensated through the diode-connected first transistor T1 and then transmitted to the red light emitting element ED_R.

The fifth transistor T5 includes a drain connected with the second initialization voltage line VL4 to which the second initialization voltage VINT2 is transmitted, a source connected with the drain of the second emission control transistor ET2, and a gate connected with the black scan line SBLj. The second initialization voltage VINT2 may have a voltage level equal to or less than that of the first initialization voltage VINT1.

The capacitor Cst has one end connected with the gate of the first transistor T1 and another end connected with the first driving voltage line VL1 as described above. A second electrode (e.g., a cathode) of the red light emitting element ED_R may be connected with the second driving voltage line VL2 transmitting the second driving voltage ELVSS.

The second driving voltage ELVSS may have a voltage level less than that of the first driving voltage ELVDD. In an embodiment of the present disclosure, the second driving voltage ELVSS may have a voltage level less than that of each of the first and second initialization voltages VINT1 and VINT2.

Referring to FIGS. 6A and 6B, the j-th emission control signal EMj has a high level during a non-emission period NEP. Within the non-emission period NEP, the j-th initialization scan signal Slj is activated. During an activation period AP1 (hereinafter, a first activation period) of the j-th initialization scan signal Slj, when the j-th initialization scan signal Slj having a high level is provided through the j-th initialization scan line SILj, the fourth transistor T4 is turned on in response to the j-th initialization scan signal Slj. The first initialization voltage VINT1 is transmitted to the gate of the first transistor T1 through the turned-on fourth transistor T4, and the first node N1 is initialized to the first initialization voltage VINT1. Thus, the first activation period AP1 may be defined as an initialization period of the red pixel PX-R.

Thereafter, when the j-th compensation scan signal SCj is activated, and the j-th compensation scan signal SCj is provided through the j-th compensation scan line SCLj during an activation period (hereinafter, a second activation period) of the j-th compensation scan signal SCj, the third transistor T3 is turned on. The first transistor T1 is diode-connected by the turned-on third transistor T3 and forward-biased. The first activation period AP1 may not overlap the second activation period AP2.

Within the second activation period AP2, the j-th write scan signal SWj is activated. The j-th write scan signal SWj has a low level during an activation period AP4 (hereinafter, a fourth activation period). During the fourth activation period AP4, the second transistor T2 is turned on by the j-th write scan signal SWj. Then, a compensation voltage ("Di−Vth") in which the i-th data signal Di provided from the i-th data line DLi is decreased as much as a threshold voltage Vth of the first transistor T1 is applied to the gate of the first transistor T1. For example, a potential of the gate of the first transistor T1 may be the compensation voltage ("Di−Vth"). The fourth activation period AP4 may overlap the second activation period AP2. The second activation period AP2 may have a duration time greater than that of the fourth activation period AP4.

The first driving voltage ELVDD and the compensation voltage ("Di−Vth") may be applied to both ends of the capacitor Cst, and charges corresponding to a voltage difference between the ends of the capacitor Cst may be stored in the capacitor Cst. Here, a high level period of the j-th compensation scan signal SCj may be referred to as a compensation period of the red pixel PX-R.

Also, the j-th black scan signal SBj is activated in the second activation period AP2 of the j-th compensation scan signal SCj. The j-th black scan signal SBj has a low level during an activation period AP3 (hereinafter, a third activation period). During the third activation period, the fifth transistor T5 is turned on by receiving the j-th black scan signal SBj having the low level through the j-th black scan line SBLj. The fifth transistor T5 may enable a portion of the driving current Id to escape through the fifth transistor T5 as a bypass current. The third activation period AP3 may overlap the second activation period AP2. The second activation period AP2 may have a duration time greater than that of the third activation period AP3. The third activation period AP3 precedes the fourth activation period AP4 and does not in overlap with the fourth activation period AP4.

When the red pixel PX-R displays a black image, and the red light emitting element ED_R emits light although a minimum driving current of the first transistor T1 flows as the driving current Id, the red pixel PX-R may not normally display a black image. Thus, the fifth transistor T5 in the red pixel PX-R according to an embodiment of the present disclosure may distribute a portion of the minimum driving current of the first transistor T1, as a bypass current Ibp, to a different current path instead of a current path of the red light emitting element ED_R. Here, the minimum driving current of the first transistor T1 represent a current flowing to the first transistor T1 in a condition in which the first transistor T1 is turned off because a gate-source voltage Vgs of the first transistor T1 is less than threshold voltage Vth. Under the condition of turning off the first transistor T1, the minimum driving current (e.g., a current of 10 pA or less) flowing to the first transistor T1 is transmitted to the red light emitting element ED_R to display a black gradation image. When the red pixel PX-R displays a black image, an effect of the bypass current Ibp to the minimum driving current is relatively large. When the red pixel PX-R displays a general image or a white image, the effect of the bypass current Ibp to the minimum driving current is almost nonexistent. Thus, when the red pixel PX-R displays a black image, as a current (e.g., a light emitting current Ied) decreased as much as a current amount of the bypass current Ibp escaped through the fifth transistor T5 is provided to the red light emitting element ED_R, the black image may be expressed (e.g., exactly expressed). Thus, the red pixel PX-R may realize an exact black gradation image by using the fifth transistor T5 and, as a result, improve a contrast ratio.

Thereafter, the j-th emission control signal EMj provided from the j-th emission control line EMLj is changed from a high level to a low level. The first and second emission control transistors ET1 and ET2 are turned on by the emission control signal EMj having the low level. Then, as the driving current Id corresponding to a voltage difference between the first driving voltage ELVDD and the gate of the first transistor T1 is generated, and the driving current Id is provided to the red light emitting element ED_R through the second emission control transistor ET2, the current Ied flows through the red light emitting element ED_R.

Referring to FIG. 6A again, the sensor FX is connected to a d-th readout line RLd from among the readout lines RL1 to RLh, the j-th write scan line SWLj, and a reset control line RCL.

The sensor FX includes at least one photosensitive element OPD1 and OPD2 and the sensor driving circuit O_SD. Two photosensitive elements OPD1 and OPD2 that are connected in parallel are illustrated as an example. The first and second photosensitive element OPD1 and OPD2 may be connected to a first sensing node SN1, and a second electrode of the first and second photosensitive element OPD1 and OPD2 may be connected to the second driving voltage line VL2 transmitting the second driving voltage ELVSS.

The sensor driving circuit O_SD includes three transistors ST1 to ST3. The three transistors ST1 to ST3 may include a reset transistor ST1, an amplifying transistor ST2, and an output transistor ST3. At least one of the reset transistor ST1, the amplifying transistor ST2, and the output transistor ST3 may be an oxide semiconductor transistor. In an embodiment of the present disclosure, the reset transistor ST1 may be an oxide semiconductor transistor, and each of the amplifying transistor ST2 and the output transistor ST3 may be a silicon transistor. However, the present disclosure is not limited thereto. For example, each of the reset transistor ST1 and the output transistor ST3 may be an oxide semiconductor transistor, and the amplifying transistor ST2 may be a silicon transistor.

Also, a portion of the reset transistor ST1, the amplifying transistor ST2, and the output transistor ST3 may be a p-type transistor and a portion thereof may be a n-type transistor. In an embodiment of the present disclosure, each of the amplifying transistor ST2 and the output transistor ST3 may be a PMOS transistor, and the reset transistor ST1 may be a NMOS transistor. However, the present disclosure is not limited thereto. For example, all of the reset transistor ST1, the amplifying transistor ST2, and the output transistor ST3 may be a n-type transistor, or all thereof may be a p-type transistor. Hereinafter, a source, a drain, and a gate of each of the amplifying transistor ST2 and the output transistor ST3 will be described as being a PMOS transistor, and a source, a drain, and a gate of the reset transistor ST1 will be described as being a NMOS transistor.

A portion of the reset transistor ST1, the amplifying transistor ST2, and the output transistor ST3 may be the same-type transistor as each of the third and fourth transistors T3 and T4 of the red pixel PX-R. Each of the amplifying transistor ST2 and the output transistor ST3 may be the same-type transistor as each of the first, second, and fifth transistors T1, T2, and T5 and the first and second emission control transistors ET1 and ET2.

However, the circuit configuration of the sensor driving circuit O_SD is not limited to the embodiment shown in FIG. 6A. The sensor driving circuit O_SD illustrated in FIG. 6A is merely illustrative, and the sensor driving circuit O_SD may include various configurations.

The reset transistor ST1 includes a source receiving a reset voltage Vrst, a drain connected with the first sensing node SN1, and a gate receiving a rest control signal RST. The reset transistor ST1 may reset a potential of the first sensing node SN1 to the rest control signal RST in response to the rest control signal RST. The rest control signal RST may be a signal provided through a reset control line RCL. However, the present disclosure is not limited thereto. In other embodiments, the rest control signal RST may be the j-th compensation scan signal SCj provided through the j-th compensation scan line SCLj. For example, the reset transistor ST1 may receive the j-th compensation scan signal SCj provided from the j-th compensation scan line SCLj as the rest control signal RST. In an embodiment of the present disclosure, the reset voltage Vrst may have a voltage level less than that of the second driving voltage ELVSS during an activation period of the rest control signal RST. The reset voltage Vrst may be a DC voltage maintaining a voltage level less than that of the second driving voltage ELVSS.

The amplifying transistor ST2 includes a source receiving a sensing driving voltage SLVD, a drain connected with a second sensing node SN2, and a gate connected with the first sensing node SN1. The amplifying transistor ST2 may be turned on according to the potential of the first sensing node SN1 and may apply the sensing driving voltage SLVD to the second sensing node SN2. In an embodiment of the present disclosure, the sensing driving voltage SLVD may be one of the first driving voltage ELVDD and the first and second initialization voltages VINT1 and VINT2. When the sensing driving voltage SLVD is the first driving voltage ELVDD, the source of the amplifying transistor ST2 may be electrically connected to the first driving voltage line VL1. When the sensing driving voltage SLVD is the first initialization voltage VINT1, the source of the amplifying transistor ST2 may be electrically connected to the first initialization voltage line VL3, and when the sensing driving voltage SLVD is the second initialization voltage VINT2, the source of the amplifying transistor ST2 may be electrically connected to the second initialization voltage line VL4.

The output transistor ST3 includes a source connected with the second sensing node SN2, a drain connected with the d-th readout line RLd, and a gate receiving an output control signal. The output transistor ST3 may transmit a sensing signal FSd to the d-th readout line RLd in response to the output control signal. The output control signal may be the j-th write scan signal SWj provided through the j-th write scan line SWLj. For example, the output transistor ST3 may receive the j-th write scan signal SWj provided from the j-th write scan line SWLj as the output control signal.

The first and second photosensitive elements OPD1 and OPD2 of the sensor FX may be exposed to light during an emission period of the light emitting elements ED_R, ED_G1, ED_G2, and ED_B (see, e.g., FIG. 5A). The light may be emitted from one of the light emitting elements ED_R, ED_G1, ED_G2, and ED_B.

When the hand US_F (see, e.g., FIG. 1) of the user touches the display surface, the first and second photosensitive elements OPD1 and OPD2 may generate photocharges corresponding to light reflected by a ridge of a fingerprint or a valley between ridges, and the generated photocharges may be accumulated on the first sensing node SN1. The amplifying transistor ST2 may be a source follower amplifier that generates a source-drain current in proportional to a quantity of charges of the first sensing node SN1, which are inputted to the gate.

The j-th write scan signal SWj, having the low level, is provided to the output transistor ST3 through the j-th write scan line SWLj during the fourth activation period AP4 (see, e.g., FIG. 6B). When the output transistor ST3 is turned on in correspondence to the j-th write scan signal SWj, a sensing signal FSd corresponding to a current flowing through the amplifying transistor ST2 may be outputted to the d-th readout line RLd.

Thereafter, when the rest control signal RST, having the high level, is provided through the reset control line RCL during a reset period RSP (see, e.g., FIG. 5C), the rest transistor ST1 is turned on. The reset period RSP may be defined as an activation period (e.g., a high level period) of the reset control line RCL. In other embodiments, when the reset transistor ST1 is the PMOS transistor, the reset control signal RST, having the low level, may be provided to the reset control line RCL during the reset period RSP. During the rest period RSP, the first sensing node SN1 may be reset to a potential corresponding to the reset voltage Vrst. In an embodiment of the present disclosure, the reset voltage Vrst may have a voltage level less than that of the second driving voltage ELVSS.

Thereafter, when the reset period RSP concludes, the first and second photosensitive elements OPD1 and OPD2 may generate photocharges corresponding to the received light, and the generated photocharges may be accumulated on the first sensing node SN1.

Figure 7:
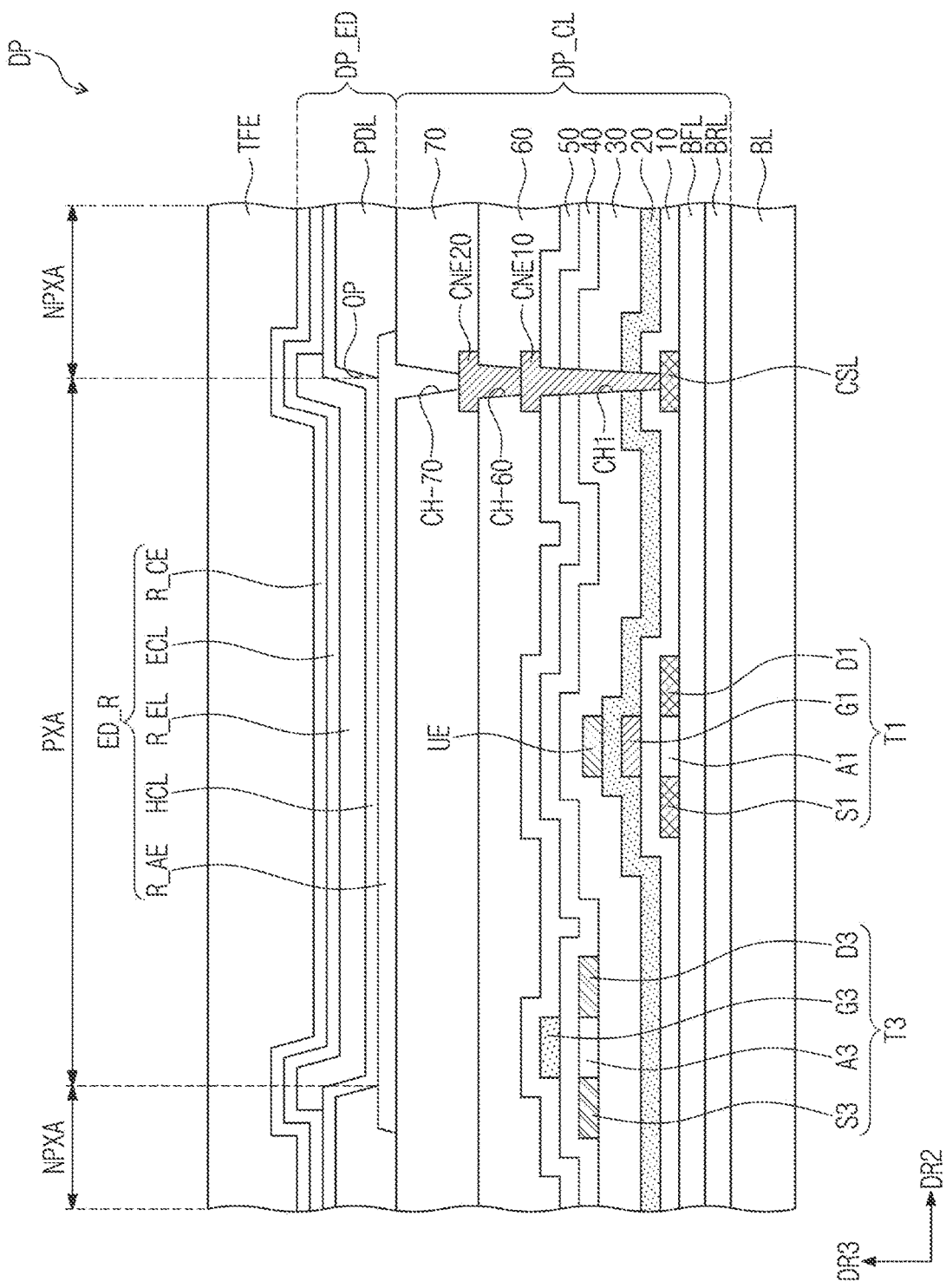
FIG. 7 is a cross-sectional view illustrating the display panel according to an embodiment of the present disclosure.
Figure 8A:
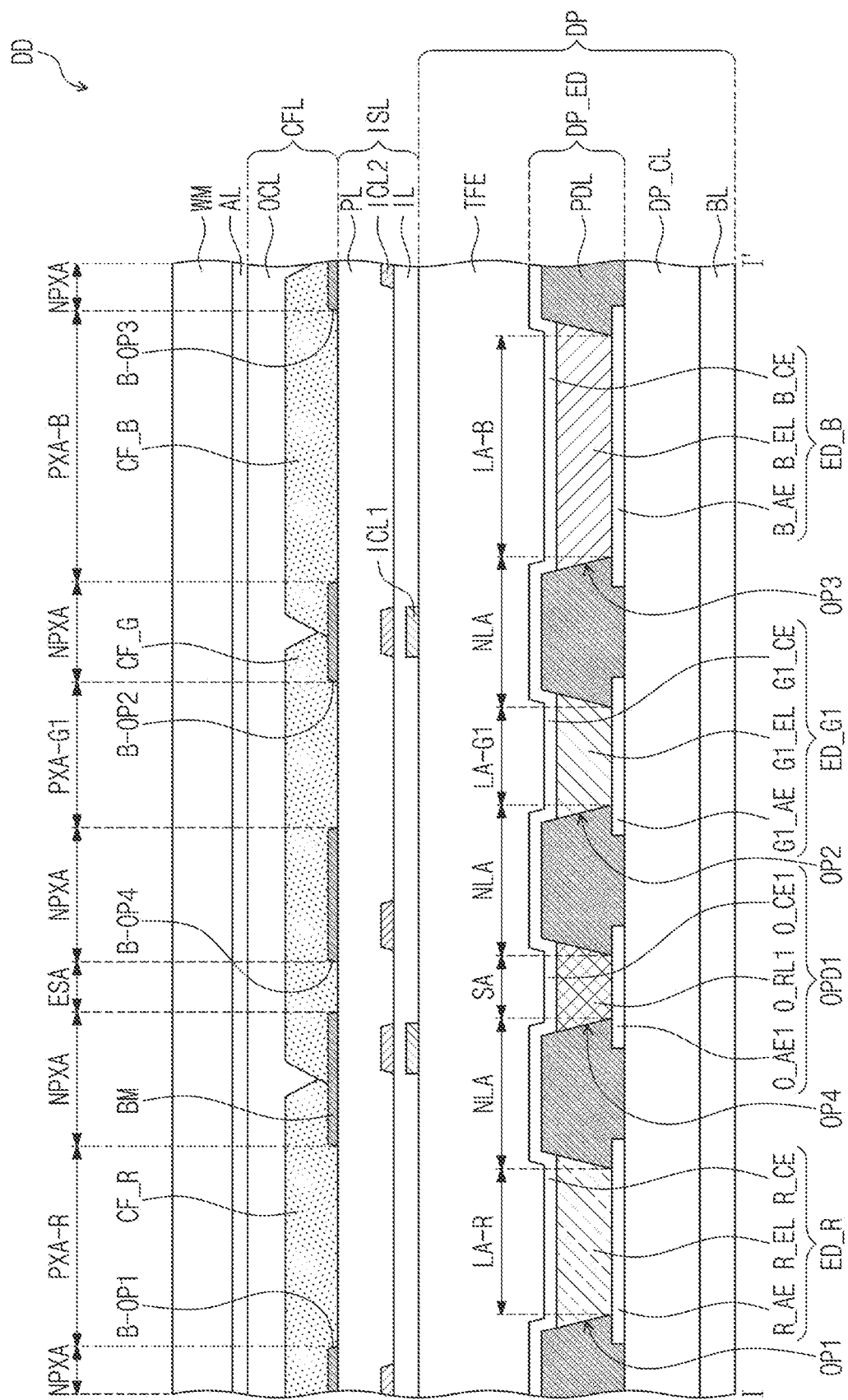
FIGS. 8A and 8B are cross-sectional views taken along the line I-I' of FIGS. 4 and 5A and illustrating the display device.
Figure 8B:
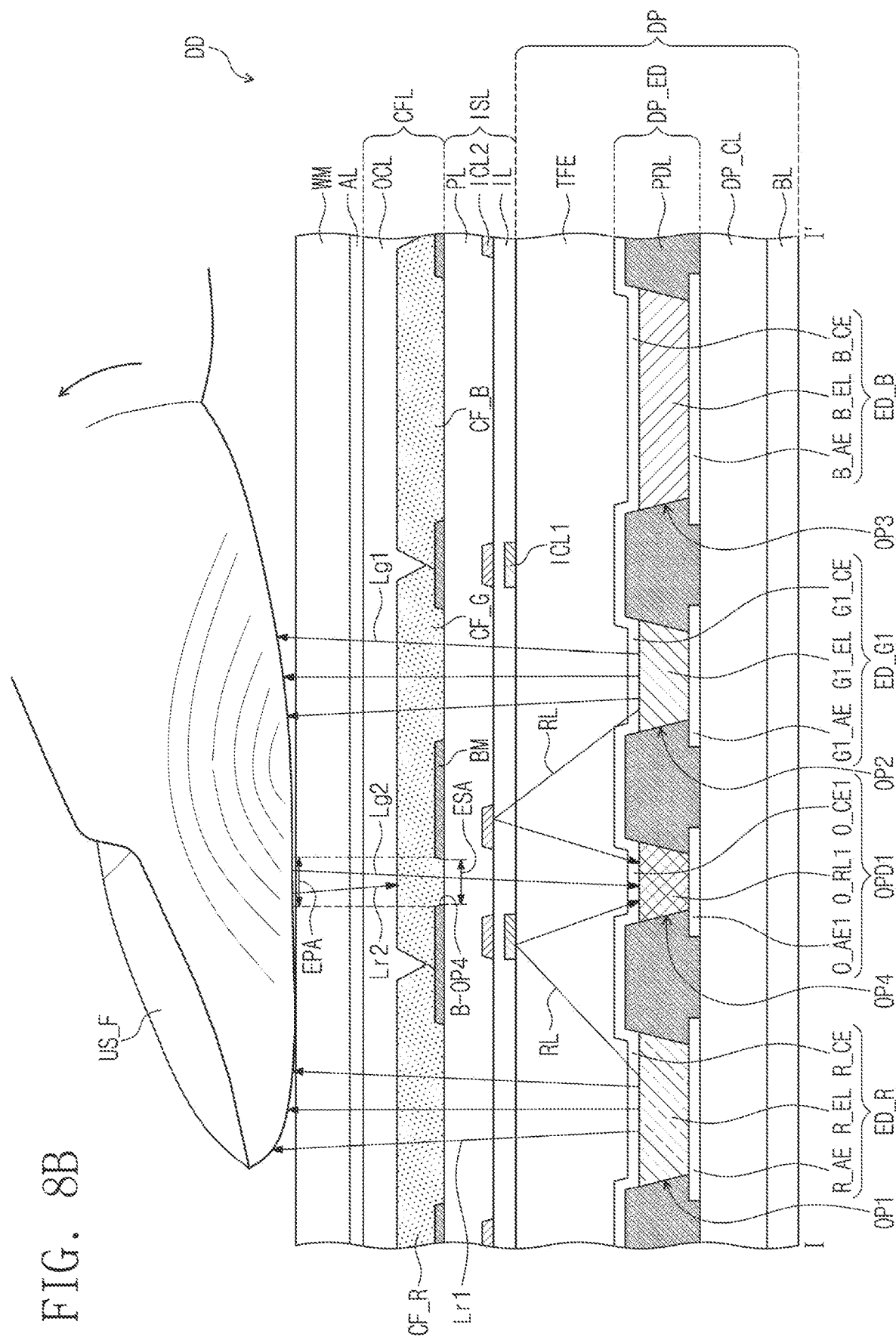

FIG. 7 is a cross-sectional view illustrating the display panel DP according to an embodiment of the present disclosure. FIGS. 8A and 8B are cross-sectional views taken along the line I-I' of FIGS. 4 and 5A and illustrating the display device DD.

Referring to FIG. 7, the display panel DP may include a base layer BL, a circuit layer DP_CL disposed on the base layer BL, an element layer DP_ED, and a thin-film encapsulation layer TFE.

The base layer BL may include a synthetic resin layer. The synthetic resin layer may include a thermosetting resin. The synthetic resin layer may be a polyimide-based resin layer, but the present disclosure is not limited thereto. The synthetic resin layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, and a perylene-based resin. In addition, the base layer may include a glass substrate, a metal substrate, or an organic/inorganic composite substrate.

At least one inorganic layer is provided on a top surface of the base layer BL. The inorganic layer may include at least one of an aluminum oxide, a titanium oxide, a silicon oxide, a silicon oxynitride, a zirconium oxide, or a hafnium oxide. The inorganic layer may have a plurality of layers (e.g., may have multiple layers). The multi-layered inorganic layer may include a barrier layer BRL and/or a buffer layer BFL, which are described below. The barrier layer BRL and the buffer layer BFL may be selectively provided.

The barrier layer BRL may prevent foreign substances from being introduced from the outside. The barrier layer BRL may include a silicon oxide layer and a silicon nitride layer. Each of the silicon oxide layer and the silicon nitride layer may be provided in plurality, and the silicon oxide layers and the silicon nitride layers may be alternately laminated with each other.

The buffer layer BFL may be disposed on the barrier layer BRL. The buffer layer BFL improves a coupling force between the base layer BL and a semiconductor pattern and/or a conductive pattern. The buffer layer BFL may include a silicon oxide layer and a silicon nitride layer. The silicon oxide layer and the silicon nitride layer may be alternately laminated with each other.

The semiconductor pattern is disposed on the buffer layer BFL. Hereinafter, the semiconductor pattern that is directly disposed on the buffer layer BFL is defined as a first semiconductor pattern. The first semiconductor pattern may include a silicon semiconductor. The first semiconductor pattern may include polysilicon. However, the present disclosure is not limited thereto, and the first semiconductor pattern may include amorphous silicon.

FIG. 7 illustrates a portion of the first semiconductor pattern, and the first semiconductor pattern may be further provided on another area. An electrical property of the first semiconductor pattern is different according to whether it is doped or not. The first semiconductor pattern may include a doped area and a non-doped area. The doped area may be doped with a n-type dopant or a p-type dopant. A p-type transistor may include a doped area that is doped with the p-type dopant, and an n-type transistor may include a doped area that is doped with the n-type dopant.

The doped area has a conductivity greater than that of the non-doped area and acts as an electrode or a signal line. The non-doped area substantially corresponds to a channel region of a transistor. For example, one portion of the first semiconductor pattern may be a channel region of a transistor, another portion may be a source or a drain of the transistor, and another portion may be a connection signal line (or a connection electrode).

As illustrated in FIG. 7, a source S1, a channel region A1, and a drain D1 of the first transistor T1 may be provided from the first semiconductor pattern. The source S1 and the drain D1 of the first transistor T1 extend from the channel region A1 in opposite directions.

In FIG. 7, a portion of a signal transmission area CSL provided from the semiconductor pattern is illustrated. The signal transmission area CSL may be connected to the drain of the second emission control transistor ET2 (see, e.g., FIG. 6A) on a plane.

A first insulation layer 10 is disposed on the buffer layer BFL. The first insulation layer 10 overlaps the plurality of pixels PX (see, e.g., FIG. 3) in common and covers the first semiconductor pattern. The first insulation layer 10 may be an inorganic layer and/or an organic layer and may have a single-layer or multi-layer structure. The first insulation layer 10 may include at least one of an aluminum oxide, a titanium oxide, a silicon oxide, a silicon oxynitride, a zirconium oxide, and a hafnium oxide. In the illustrated embodiment, the first insulation layer 10 is a single layer silicon oxide layer. In addition to the first insulation layer 10, an insulation layer of the circuit layer DP_CL may be an inorganic layer and/or an organic layer and may have a single-layer or multi-layer structure. The inorganic layer may include at least one of the above-described materials.

A gate G1 of the first transistor T1 is disposed on the first insulation layer 10. The gate G1 may be a portion of a metal pattern. The gate G1 of the first transistor T1 overlaps the channel region A1 of the first transistor T1. The gate G1 of the first transistor T1 may act as a mask in a process of doping the first semiconductor pattern.

A second insulation layer 20 is disposed on the first insulation layer 10 and covers the gate G1. The second insulation layer 20 overlaps the plurality of pixels PX (see, e.g., FIG. 3) in common. The second insulation layer 20 may be an inorganic layer and/or an organic layer and may have a single-layer or multi-layer structure. In the illustrated embodiment, the second insulation layer 20 is a single layer silicon oxide layer.

An upper electrode UE may be disposed on the second insulation layer 20. The upper electrode UE may overlap the gate G1. The upper electrode UE may be a portion of a metal pattern or a portion of a semiconductor pattern. The capacitor Cst (see, e.g., FIG. 6A) may be defined by a portion of the gate G1 and the upper electrode UE overlapping the gate G1. In some embodiments of the present disclosure, the upper electrode UE may be omitted.

In some embodiments of the present disclosure, an insulation pattern may be formed instead of (or from) the second insulation layer 20. The upper electrode UE is disposed on the insulation pattern. The upper electrode UE may act as a mask for providing the insulation pattern from the second insulation layer 20.

A third insulation layer 30 covering the upper electrode UE may be disposed on the second insulation layer 20. In the illustrated embodiment, the third insulation layer 30 is a single layer silicon oxide layer. The semiconductor pattern is disposed on the third insulation layer 30. Hereinafter, the semiconductor pattern that is directly disposed on the third insulation layer 30 is defined as a second semiconductor pattern. The second semiconductor pattern may include a metal oxide. The oxide semiconductor may include a crystalline or amorphous oxide semiconductor. For example, the oxide semiconductor may include a metal, such as zinc (Zn), indium (In), gallium (Ga), tin (Sn), and titanium (Ti), an oxide thereof, or a mixture thereof. The oxide semiconductor may include a indium-tin oxide (ITO), a indium-gallium-zinc oxide (IGZO), a zinc oxide (ZnO), a indium-zinc oxide (IZO), a zinc-indium oxide (ZIO), a indium oxide (InO), a titanium oxide (TiO), a indium-zinc-tin oxide (IZTO), and a zinc-tin oxide (ZTO).

FIG. 7 illustrates a portion of the second semiconductor pattern, and the second semiconductor pattern may be further provided on another area. The second semiconductor pattern may include a plurality of regions that are distinguished according to whether the metal oxide is reduced. A region (hereinafter, referred to as a reduction region) in which the metal oxide is reduced has a conductivity greater than that of a region (hereinafter, referred to as a non-reduction region) in which the metal oxide is not reduced. The reduction region acts as an electrode or a signal line. The non-reduction region corresponds to a channel part of the transistor. For example, one portion of the second semiconductor pattern may be the channel region of the transistor, and another portion may be the source or the drain of the transistor.

As illustrated in FIG. 7, a source S3, a channel region A3, and a drain D3 of the third transistor T3 may be provided from the second semiconductor pattern. The source S3 and the drain D3 include metal reduced from the metal oxide semiconductor. Each of the source S3 and the drain D3 may have a thickness (e.g., a predetermined thickness) from a top surface of the second semiconductor pattern and may include a metal layer including the reduced metal.

A fourth insulation layer 40 covering the second semiconductor pattern is disposed on the third insulation layer 30. In the illustrated embodiment, the fourth insulation layer 40 is a single layer silicon oxide layer. A gate G3 of the third transistor T3 is disposed on the fourth insulation layer 40. The gate G3 may be a portion of a metal pattern. The gate G3 of the third transistor T3 overlaps the channel region A3 of the third transistor T3.

In some embodiments of the present disclosure, an insulation pattern may be formed instead of (or from) the fourth insulation layer 40. The gate G3 of the third transistor T3 is disposed on the insulation pattern. In such an embodiment, the gate G3 may have the same shape as the insulation pattern on a plane. Although one gate G3 is illustrated for convenience of description, the third transistor T3 may include two gates.

A fifth insulation layer 50 covering the gate G3 is disposed on the fourth insulation layer 40. The fifth insulation layer 50 may include a silicon oxide layer and a silicon nitride layer. The fifth insulation layer 50 may include a plurality of silicon oxide layers and a plurality of silicon nitride layers, which are alternately laminated with each other.

A source and a drain of the fourth transistor T4 (see, e.g., FIG. 5A) may be provided through the same process as the source S3 and the drain D3 of the third transistor T3. Also, a source and a drain of the reset transistor ST1 (see, e.g., FIG. 5A) of the sensor FX (see, e.g., FIG. 5A) and a source and a drain of the output transistor ST3 (see, e.g., FIG. 5A) may be provided through the same process as the source S3 and the drain D3 of the third transistor T3 at the same time.

At least one insulation layer is further disposed on the fifth insulation layer 50. In the illustrated embodiment, a sixth insulation layer 60 and a seventh insulation layer 70 are disposed on the fifth insulation layer 50. Each of the sixth insulation layer 60 and the seventh insulation layer 70 may be an organic layer and may have a single-layer or multi-layer structure. Each of the sixth insulation layer 60 and the seventh insulation layer 70 may be a single layer polyimide-based resin layer. However, the present disclosure is not limited thereto. For example, each of the sixth insulation layer 60 and the seventh insulation layer 70 may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, and a perylene-based resin.

A first connection electrode CNE10 may be disposed on the fifth insulation layer 50. The first connection electrode CNE10 may be connected to the signal transmission area CSL through a first contact hole (e.g., a first contact opening) CH-1 passing through the first to fifth insulation layers 10 to 50, and the second connection electrode CNE20 may be connected to the first connection electrode CNE10 through a contact hole (e.g., a contact opening) CH-60 passing through the sixth insulation layer 60. In an embodiment of the present disclosure, at least one of fifth insulation layer 50 to the seventh insulation layer 70 may be omitted.

The element layer DP_ED includes the red light emitting element ED_R and a pixel defining layer PDL. The first electrode R_AE of the red light emitting element ED_R is disposed on the seventh insulation layer 70. The first electrode R_AE of the red light emitting element ED_R may be connected to the second connection electrode CNE20 through a contact hole (e.g., a contact opening) CH-70 passing through the seventh insulation layer 70.

An opening OP in the pixel defining layer PDL exposes at least a portion of the first electrode R_AE of the red light emitting element ED_R. The opening OP in the pixel defining layer PDL may define a red light emitting area LA-R. The red light emitting area LA-R is defined in correspondence to (or according to) an exposed portion of the first electrode R_AE, and a non-light emitting area NLA is defined adjacent thereto.

A hole control layer HCL may be disposed on the light emitting area LA and the non-light emitting area NLA in common. A common layer, such as the hole control layer HCL, may be provided on the plurality of pixels PX in common. The hole control layer HCL may include a hole transport layer and a hole injection layer.

A red light emitting layer R_EL is disposed on the hole control layer HCL. The red light emitting layer R_EL may be disposed only on an area corresponding to the opening OP. The red light emitting layer R_EL may be divided and provided on each of the plurality of pixels PX.

Although the patterned red light emitting layer R_EL is illustrated as an example, the present disclosure is not limited thereto. A common light emitting layer may be disposed on the plurality of pixels PX in common. The common light emitting layer may generate white light or blue light.

An electronic control layer ECL is disposed on the red light emitting layer R_EL. The electron control layer ECL may include an electron transport layer and an electron injection layer. A second electrode R_CE of the red light emitting element ED_R is disposed on the electron control layer ECL. The electron control layer ECL and the second electrode R_CE are disposed on the plurality of pixels PX in common.

The thin-film encapsulation layer TFE is disposed on the second electrode R_CE. The thin-film encapsulation layer TFE may cover the plurality of pixels PX. The thin-film encapsulation layer TFE may directly cover the second electrode R_CE. In another embodiment of the present disclosure, the display panel DP may further include a capping layer that directly covers the second electrode R_CE. In an embodiment of the present disclosure, the red light emitting element ED_R may have a laminated structure that is vertically inverted from a structure illustrated in FIG. 7.

Although the circuit layer DP_CL is illustrated in FIGS. 8A and 8B, the circuit layer DP_CL is primarily described above with reference to FIG. 7. Referring to FIGS. 8A and 8B, first to third openings OP1, OP2, and OP3 in the pixel defining layer PDL respectively expose at least a portion of the first electrodes R_AE, G_AE1, and B_AE of the red, green, and blue light emitting elements ED_R, ED_G1, and ED_B. Also, a fourth opening OP4 in the pixel defining layer PDL exposes at least a portion of the first electrode O_AE1 of the first photosensitive element OPD1. A portion of the first electrode O_AE1 exposed from the fourth opening OP4 may be defined as the sensing area SA.

In an embodiment of the present disclosure, the pixel defining layer PDL may further include a black material. The pixel defining layer PDL may further include black organic dye/pigment, such as carbon black or aniline black. The pixel defining layer PDL may be provided as a blue organic material and a black organic material that are mixed. The pixel defining layer PDL may further include a liquid-repellent (e.g., hydrophobic) organic material.

As illustrated in FIG. 8A, the non-light emitting area NLA is defined to be adjacent to the red, green, and blue light emitting areas LA-R, LA-G1, and LA-B and the sensing area SA. While no light is emitted at the sensing area SA, for the convenience of explanation, it is separately defined as the sensing area SA. The red, green, and blue light emitting layers R_EL, G1_EL, and B_EL are respectively disposed on the first electrodes R_AE, G_AE1, and B_AE of the red, green, blue light emitting elements ED_R, ED_G1, and ED_B. Although the patterned red, green, and blue light emitting layers R_EL, G1_EL, and B_EL are illustrated as an example in this embodiment, one light emitting layer may be disposed on the red, green, and blue light emitting areas LA-R, LA-G1, and LA-B and the non-light emitting area NLA in common. In such an embodiment, the light emitting layer may generate white light or blue light. Also, the light emitting layer may have a multilayer structure that is referred to as a tandem.

Each of the red, green, and blue light emitting layers R_EL, G1_EL, and B_EL may include a low molecular weight organic material or a high molecular weight organic material. In other embodiments, each of the red, green, and blue light emitting layers R_EL, G1_EL, and B_EL may include a quantum dot as the light emitting material. The quantum dot may have a core selected from the group consisting of Group II-VI compound, Group III-V compound, Group IV-VI compound, Group IV element, Group IV compound, and a combination thereof.

The photoelectric conversion layer O_RL1 is disposed on the first electrode O_AE1 of the first photosensitive element OPD1. The photoelectric conversion layer O_RL1 may include an organic photo-sensing material (e.g., a photosensitive semiconductor material). A second electrode layer is disposed on the red, green, and blue light emitting layers R_EL, G1_EL, and B_EL and the photoelectric conversion layer O_RL1 in common. The second electrode layer may include the second electrodes R_CE, G_CE1, and B_CE of the red, green, and blue light emitting elements ED_R, ED_G1, and ED_B and the second electrode O_CE1 of the first photosensitive element OPD1.

An electric field (e.g., a predetermined electric field) may be formed between the first electrode O_AE1 and the second electrode O_CE1 of the first photosensitive element OPD1. The photoelectric conversion layer O_RL1 generates an electric signal corresponding to incident light. The photoelectric conversion layer O_RL1 may absorb energy of the incident light to generate charges.

The charges generated in the photoelectric conversion layer O_RL1 change the electric field between the first electrode O_AE1 and the second electrode O_CE1. A quantity of the charges generated in the photoelectric conversion layer O_RL1 may vary according to whether light is incident to the first photosensitive element OPD1 and a quantity and an intensity of light incident to the first photosensitive element OPD1. Thus, the electric field between the first electrode O_AE1 and the second electrode O_CE1 may vary (e.g., may measurably or predictably vary). The first photosensitive element OPD1, according to an embodiment of the present disclosure, may obtain fingerprint information of the user through the variation of the electric field between the first electrode O_AE1 and the second electrode O_CE1.

In other embodiments, the first photosensitive element OPD1 may include a phototransistor including the photoelectric conversion layer O_RL1 as an activation layer. In such an embodiment, the first photosensitive element OPD1 may obtain fingerprint information by sensing a quantity of a current flowing through the phototransistor. The first photosensitive element OPD1, according to an embodiment of the present disclosure, may include various photoelectric conversion elements generating an electrical signal in correspondence to variation of a quantity of light. However, the embodiment of the present disclosure is not limited thereto.

The thin-film encapsulation layer TFE is disposed on the element layer DP_ED. The thin-film encapsulation layer TFE include at least an inorganic layer or an organic layer. In an embodiment of the present disclosure, the thin-film encapsulation layer TEF may include two inorganic layers and an organic layer disposed therebetween. In an embodiment of the present disclosure, the thin-film encapsulation layer TEF may include a plurality of inorganic layers and a plurality of organic layers, which are alternately laminated with each other.

The input sensor ISL may be disposed on the thin-film encapsulation layer TEF, and an anti-reflection layer CFL may be disposed on the input sensor ISL.

The input sensor ISL may be directly disposed on the thin-film encapsulation layer TFE. The input sensor ISL may include a first conductive layer ICL1, a first insulation layer IL, a second conductive layer ICL2, and a second insulation layer PL. The first conductive layer ICL1 may be directly disposed on the thin-film encapsulation layer TFE. Although the first conductive layer ICL1 is directly disposed on the thin-film encapsulation layer TFE in the embodiment illustrated in FIGS. 8A and 8B, the present disclosure is not limited thereto. The input sensor ISL may further include a base insulation layer disposed between the first conductive layer ICL1 and the thin-film encapsulation layer TFE. In such an embodiment, the thin-film encapsulation layer TFE may be covered by the base insulation layer, and the first conductive layer ICL1 may be disposed on the base insulation layer. In an embodiment of the present disclosure, the base insulation layer may include an inorganic layer.

The first insulation layer IL may cover the first conductive layer ICL1. The first insulation layer IL may include an inorganic layer. The second conductive layer ICL2 is disposed on the first insulation layer IL. Each of the first and second conductive layers ICL1 and ICL2 may include a plurality of conductive patterns. Hereinafter, the first conductive layer ICL1 is described as first conductive patterns, and the second conducive layer ICL2 is described as second conductive patterns. The first conductive patterns ICL1 and the second conductive patterns ICLS may define the sensing electrode. A detailed description thereof is provided below.

Although the input sensor ISL is illustrated as including the first and second conductive layers ICL1 and ICL2, the present disclosure is not limited thereto. For example, the input sensor ISL may include only one of the first and second conductive layers ICL1 and ICL2. The sensing electrode may be provided in the form of a single layer.

The second insulation layer PL may be disposed on the second conductive layer ICL2. The second insulation layer PL may contain an organic insulating material. The second insulation layer PL protects the first and second conductive layers ICL1 and ICL2.

The anti-reflection layer CFL may be directly disposed on the second insulation layer PL. The anti-reflection layer CFL may include a light shielding pattern BM. The light shielding pattern BM may be disposed in correspondence to the non-light emitting area NLA. The light shielding pattern BM include a black material. For example, the light shielding pattern BM may further include black organic dye/pigment, such as carbon black or aniline black.

First to fourth openings B-OP1, B-OP2, B-OP3, and B-OP4 corresponding to the first to fourth openings OP1, OP2, OP3, and OP4 in the pixel defining layer PDL are defined in the light shielding pattern BM. The first to third openings B-OP1, B-OP2, and B-OP3 in the light shielding pattern BM define a red pixel area PXA-R, a green pixel area PXA-G1, and a blue pixel area PXA-B, respectively. The first to third openings B-OP1, B-OP2, and B-OP3 may be defined as first color to third color openings B-OP1, B-OP2, and B-OP3, respectively, to distinguish the first to third openings B-OP1, B-OP2, and B-OP3 from the fourth opening B-OP4.

An area at where the light shielding pattern BM is disposed may be defined as a non-pixel area NPXA. The light shielding pattern BM may overlap the first and second conductive layers ICL1 and ICL2 in the non-pixel area NPXA.

Red light, green light, and blue light may be provided to the outside via the red pixel area PXA-R, the green pixel area PXA-G1, and the blue pixel area PXA-B, respectively. Each of the red pixel area PXA-R, the green pixel area PXA-G1, and the blue pixel area PXA-B may have an area greater than that of the corresponding opening from among the first to third openings OP1, OP2, and OP3 in the pixel defining layer PDL to increase an output efficiency.

The fourth opening B-OP4 in the light shielding pattern BM defines an effective sensing area ESA. The effective sensing area ESA may have an area less than that of the sensing area SA. A detailed description thereof is provided below.

The anti-reflection layer CFL may include a first color filter CF_R, a second color filter CF_G, and a third color filter CF_B. The first color filter CF_R has a first color, the second color filter CF_G has a second color, and the third color filter CF_B has a third color. Hereinafter, the first color filter CF_R, the second color filter CF_G, and the third color filter CF_B are defined as a red color filter CF_R, a green color filter CF_G, and a blue color filter CF_B, respectively.

The red color filter CF_R, the green color filter CF_G, and the blue color filter CF_B overlap the red light emitting area LA-R, the green light emitting area LA-G1, and the blue light emitting area LA-B, respectively. The green color filter CF_G may be disposed to correspond to another green light emitting area LA-G2 of the unit areas RPU shown in FIG. 4. Also, a portion of each of the red color filter CF_R, the green color filter CF_G, and the blue color filter CF_B may overlap the non-light emitting area NLA.

One of the red color filter CF_R, the green color filter CF_G, and the blue color filter CF_B may further overlap the sensing area SA. Similarly, the green color filter CF_G may overlap the sensing area SA. The green color filter CF_G may cover the effective sensing area ESA. Although an embodiment in which the green color filter CF_G overlaps the green light emitting area LA-G1 and the sensing area SA in an integrated shape, the present disclosure is not limited thereto.

The anti-reflection layer CFL may further include an over-coating layer OCL. The over-coating layer OCL may include an organic insulating material. The over-coating layer OCL may be thick enough to remove (or planarize) a stepped portion between the red, green, and blue color filters CF_R, CF_G, and CF_B.

The over-coating layer OCL may flatten a top surface of the anti-reflection layer CFL. The feature of flattening the top surface of the anti-reflection layer CFL, as a relative concept, may be sufficient as long as the over-coating layer OCL provides a flatter top surface than that of each of the red color filter CF_R, the green color filter CF_G, and the blue color filter CF_B.

As illustrated in FIG. 8B, when the display device DD operates, each of the red, green, and blue light emitting elements ED_R, ED_G, and ED_B may emit light. The red light emitting elements ED_R emit red light in a red wavelength band, the green light emitting elements ED_G1 emit green light in a green wavelength band, and the blue light emitting elements ED_B emit blue light in a blue wavelength band.

The first photosensitive element OPD1 may receive light having only a specific wavelength from among wavelengths generated by the red, green, and blue light emitting elements ED_R, ED_G1, and ED_B due to a color filter disposed on the first photosensitive element OPD1. In such an embodiment, the first photosensitive element OPD1 may receive a reflected green light Lg2. The reflected green light Lg2 may be defined as light generated as the green light Lg1 emitted from the green light emitting element ED_G1 that is reflected by a fingerprint of the user. Red light and blue light emitted, respectively, from the red and blue light emitting elements ED_R and ED_B may be also reflected by the hand US_F of the user but blocked by the green color filter CF_G. FIG. 8B illustrates the red light Lr1 output from the red light emitting element ED_R and the reflected red light Lr2 blocked by the green color filter CF_G. The reflected red light Lr2 may be defined as light reflected from the red light Lr1 by the finger (or fingerprint) of the user.

An effective fingerprint area EPA corresponding to one photosensitive element OPD1 is defined on a top surface of the window WM. The effective fingerprint area EPA is defined as an area from which the effective reflected green light Lg2 may be generated (or reflected) and at where the effective reflected green light Lg2 may pass the effective sensing area ESA and arrive at the photosensitive element OPD1 when the finger of the user contacts the top surface of the window WM.

The reflected green light Lg2 has fingerprint information (e.g., information on a ridge or a valley between ridges). The reflected green light Lg2 reflected at the outside of the effective fingerprint area EPA may not pass the effective sensing area ESA. As a result, the first photosensitive element OPD1 may obtain only information of a fingerprint overlapping the effective fingerprint area EPA.

Also, leakage reflected light RL may be generated. The leakage reflected light RL is defined as light reflected by the first conductive layer ICL1 or the second conductive layer ICL2 from among light emitted from the light emitting elements disposed around the photosensitive element OPD1 (e.g., the red and green light emitting elements ED_R and ED_G1). Light emitted with a low output angle from the red and green light emitting elements ED_R and ED_G1 is incident to the first conductive layer ICL1 or the second conductive layer ICL2 instead of being emitted to the corresponding pixel area.

The leakage reflected light RL acts as a noise when incident to the first photosensitive element OPD1. Because the first photosensitive element OPD1 receives light other than the reflected green light Lg2, exact fingerprint information may not be obtained. According to an embodiment of the present disclosure, the leakage reflected light RL may be prevented from being incident to the first photosensitive element OPD1. Hereinafter, a detailed description thereof will be described.

Figure 9A:
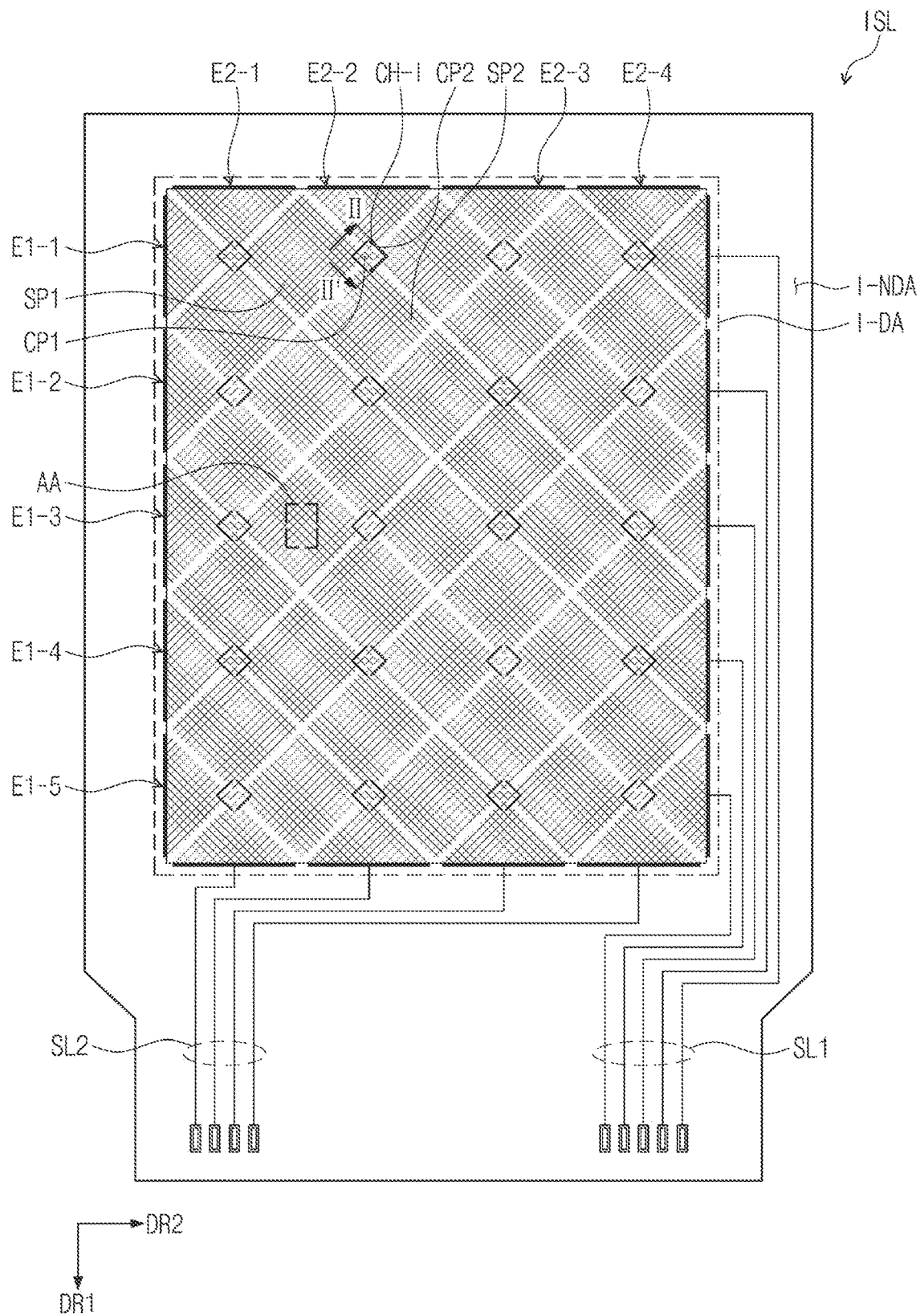
FIG. 9A is a plan view illustrating an input sensor according to an embodiment of the present disclosure.
Figure 9B:
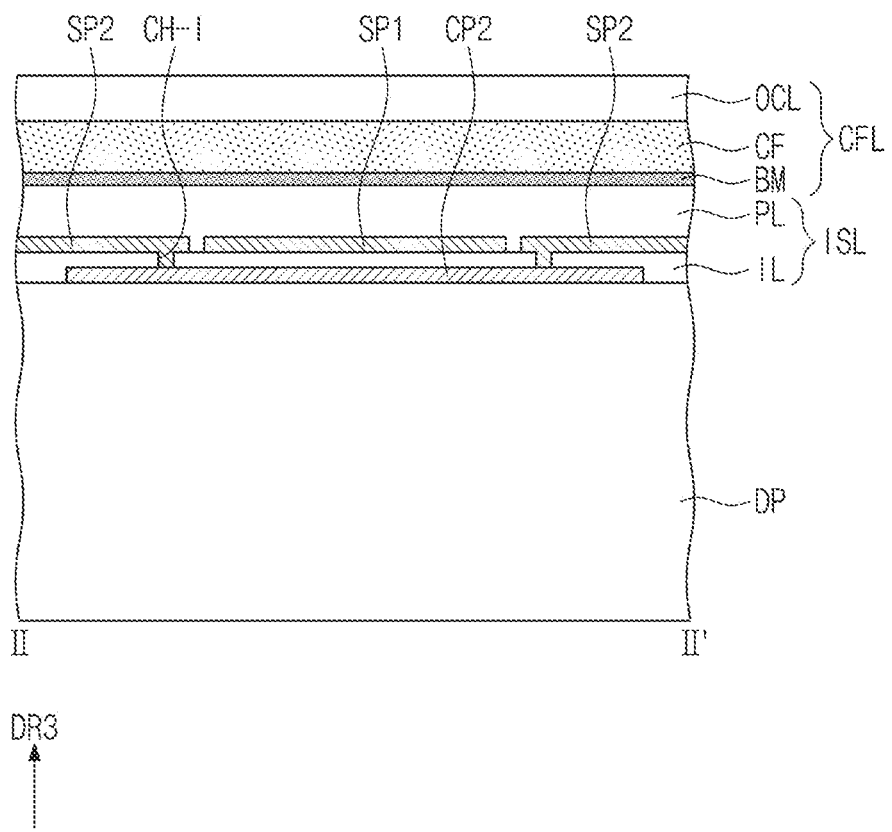
FIG. 9B is a cross-sectional view taken along the line II-II' of FIG. 9A.

FIG. 9A is a plan view illustrating the input sensor ISL according to an embodiment of the present disclosure, and FIG. 9B is a cross-sectional view taken along the line II-II' of FIG. 9A.

Referring to FIG. 9A, the input sensor ISL includes a sensing area I-DA and a non-sensing area I-NDA disposed adjacent to the sensing area I-DA. The sensing area I-DA and the non-sensing area I-NDA respectively correspond to the display area DA and the non-display area NDA shown in FIG. 3.

The input sensor ISL is disposed on the sensing area I-DA and includes first electrodes E1-1 to E1-5 and second electrode E2-1 to E2-4, which cross each other in an insulating manner. The input sensor ISL includes first signal lines SL1 disposed on the non-sensing area I-NDA and electrically connected to the first electrodes E1-1 to E1-5 and second signal lines SL2 disposed on the non-sensing area I-NDA and electrically connected to the second electrodes E2-1 to E2-4. The first electrodes E1-1 to E1-5, the second electrodes E2-1 to E2-4, the first signal lines SL1, and the second signal lines SL2 may be defined by a combination of the first conductive patterns ICL1 and the second conductive patterns ICL2 described with reference to FIGS. 8A and 8B.

Each of the first electrodes E1-1 to E1-5 and the second electrodes E2-1 to E2-4 may include a plurality of conductive lines crossing each other. The plurality of conductive lines may define a plurality of openings, and each of the first electrodes E1-1 to E1-5 and the second electrodes E2-1 to E2-4 may have a mesh shape. A detailed description thereof is provided below.

One of the first electrodes E1-1 to E1-5 and the second electrodes E2-1 to E2-4 may have an integrated shape. In the illustrated embodiment, the first electrodes E1-1 to E1-5 are illustrated as having the integrated shape as an example. The first electrodes E1-1 to E1-5 may include sensing portions SP1 and intermediate portions CP1. A portion of the second conductive patterns I-CL2 described with reference to FIGS. 8A and 8B may correspond to the first electrodes E1-1 to E1-5.

Each of the second electrodes E2-1 to E2-4 may include sensing patterns SP2 and bridge patterns CP2 (e.g., connection patterns). As illustrated in FIG. 9B, two adjacent sensing patterns SP2 may be connected to the bridge pattern CP2 through a contact hole (e.g., a contact opening) CH-I passing through the first insulation layer IL. A portion of the second conductive patterns I-CL2 described with reference to FIGS. 8A and 8B may correspond to the sensing patterns SP2, and a portion of the first conductive patterns I-CL1 may correspond to the bridge patterns CP2.

Although a cross-section corresponding to the bridge pattern CP2 is schematically illustrated in FIG. 9B, the bridge pattern CP2 may have a length substantially corresponding to a plurality of light emitting areas and a non-light emitting areas disposed therebetween. Also, although a color filter CF having an integrated shape is illustrated, the color filter CF may include the red color filter CF_R, the green color filter CF_G, and the blue color filter CF_B.

In the illustrated embodiment, the bridge patterns CP2 are provided from (or formed from) the first conductive patterns I-CL1 described with reference to FIGS. 8A and 8B, and the first electrodes E1-1 to E1-5 and the sensing patterns SP2 are provided from (or formed from) the second conductive patterns I-CL2. However, the present disclosure is not limited thereto. In other embodiments, the first electrodes E1-1 to E1-5 and the sensing patterns SP2 may be provided from (or formed from) the first conductive patterns I-CL1 described with reference to FIGS. 8A and 8B, and the bridge patterns CP2 may be provided from (or formed from) the second conductive patterns I-CL2.

One of the first signal lines SL1 and the second signal lines SL2 transmit a transmission signal for sensing an external input from an external circuit and the other transmit a variation of capacitance between the first electrodes E1-1 to E1-5 and the second electrodes E2-1 to E2-4 to an external circuit as a reception signal.

A portion of the second conductive patterns I-CL2 described with reference to FIGS. 8A and 8B may correspond to the first signal lines SL1 and the second signal lines SL2. Each of the first signal lines SL1 and the second signal lines SL2 may have a double-layer structure including a first floor line provided from the first conductive patterns I-CL1 and a second floor line provided from the second conductive patterns I-CL2. The first floor line and the second floor line may be connected through the contact hole (e.g., the contact opening) passing through the first insulation layer IL.

Figure 10A:
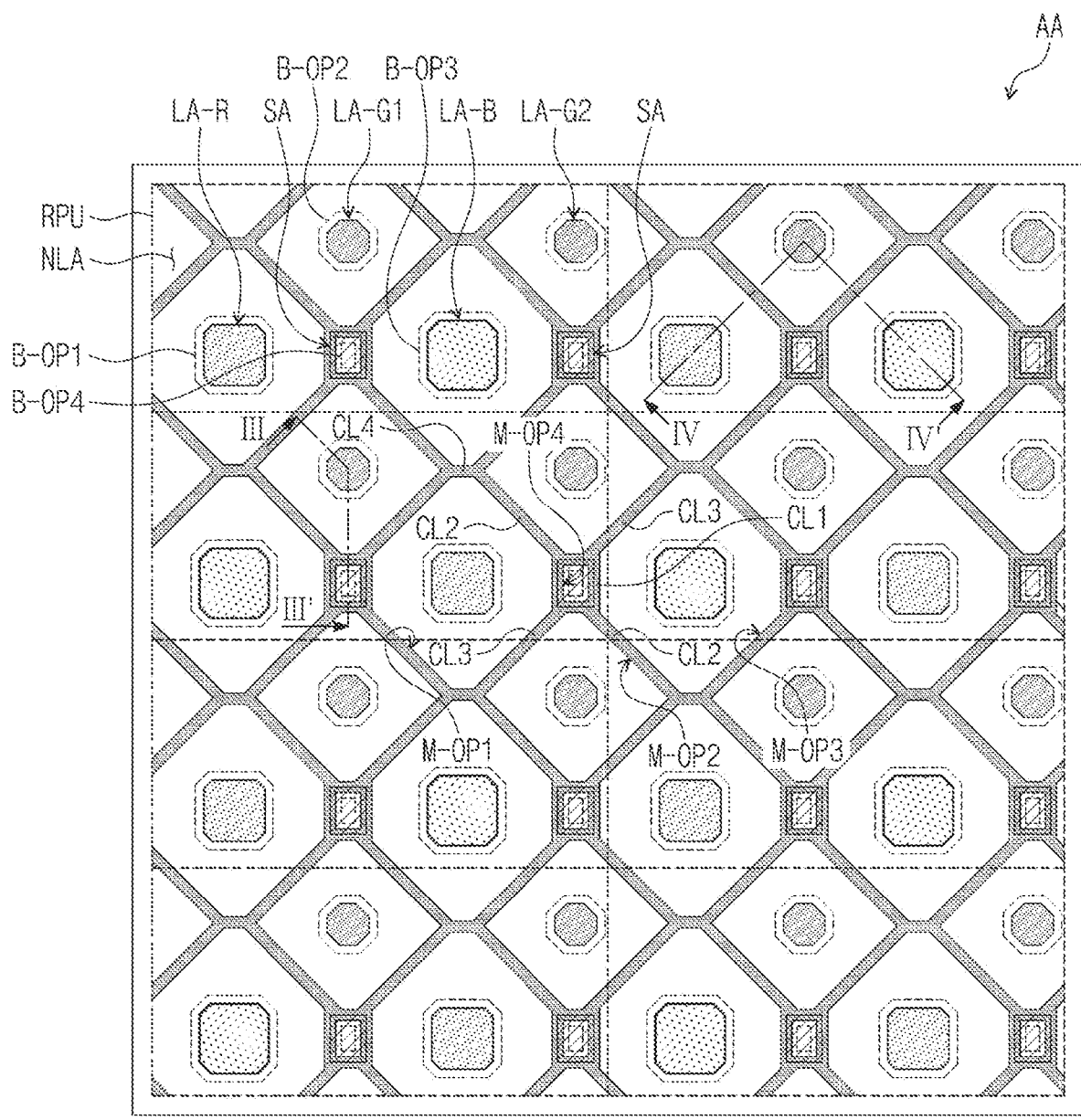
FIG. 10A is an enlarged plan view illustrating the area AA of FIG. 9A.
Figure 10B:
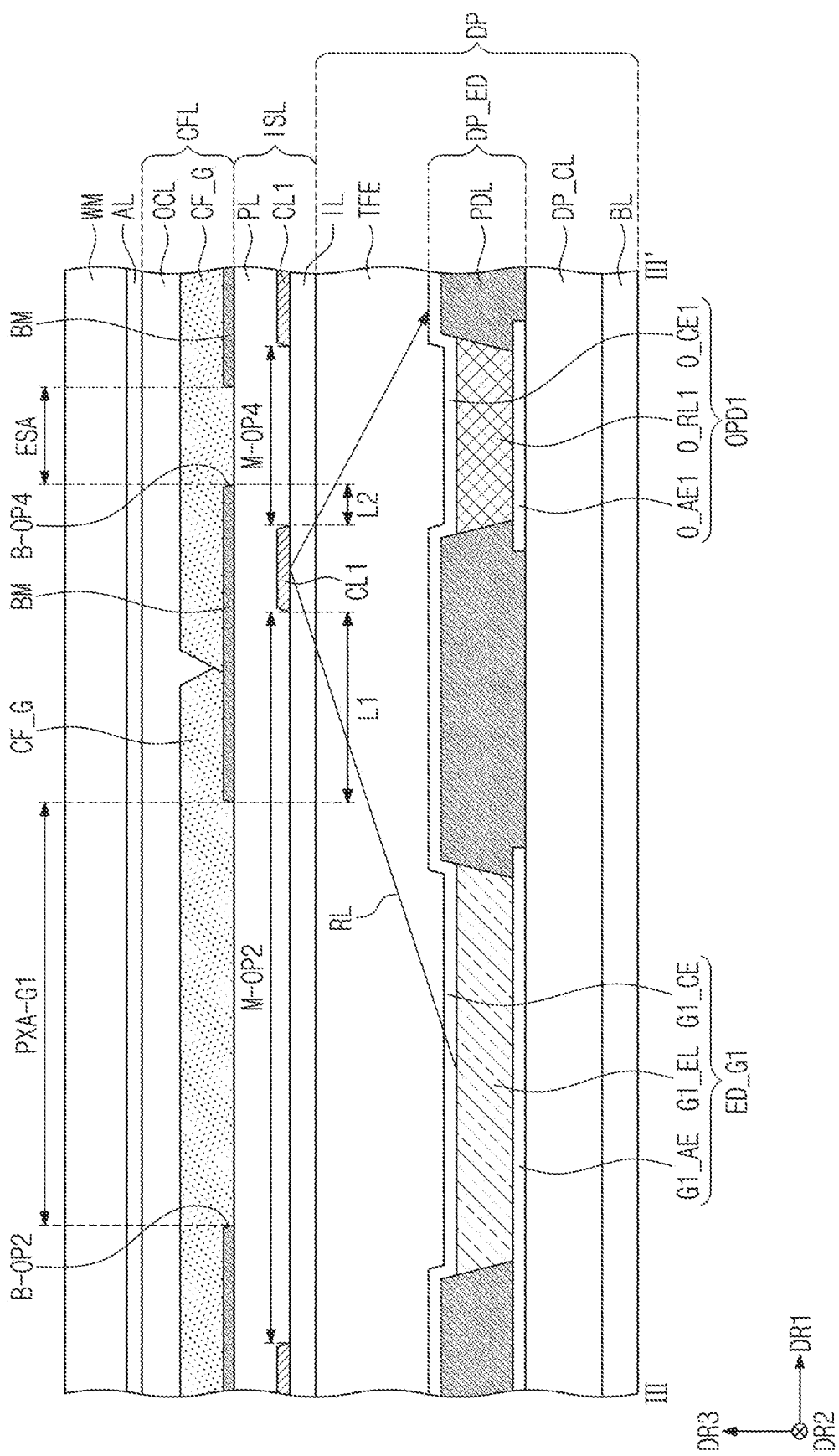
FIG. 10B is a cross-sectional view taken along the line III-III' of FIG. 10A.
Figure 10C:
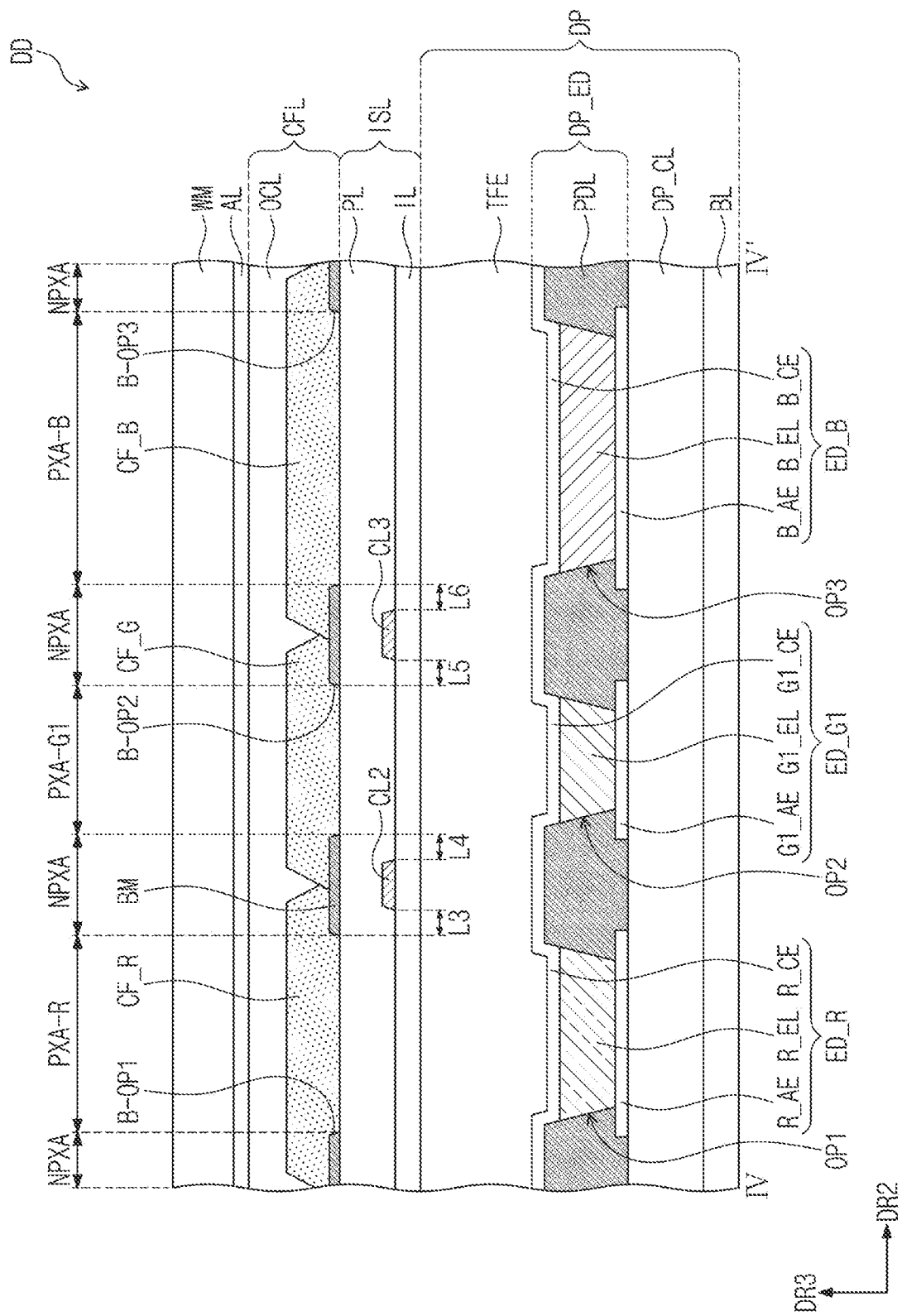
FIG. 10C is a cross-sectional view taken along the line IV-IV' of FIG. 10A.

FIG. 10A is an enlarged plan view illustrating the area AA of FIG. 9A. FIG. 10B is a cross-sectional view taken along the line III-III' of FIG. 10A. FIG. 10C is a cross-sectional view taken along the line IV-IV' of FIG. 10A.

FIG. 10A illustrates a plane corresponding to the sensing portion SP1 shown in FIG. 9A. In FIG. 10A, the red light emitting area LA-R, the green light emitting area LA-G1, and the blue light emitting area LA-B of the unit areas RPU and the sensing area SA are illustrated, and the first to fourth openings B-OP1, B-OP2, B-OP3, and B-OP4 in the light shielding pattern BM are illustrated. On a plane, the red light emitting area LA-R, the green light emitting area LA-G1, and the blue light emitting area LA-B are respectively disposed inside the first opening B-OP1, the second opening B-OP2, and the third opening B-OP3. On the plane, the fourth opening B-OP4 is disposed inside the sensing area SA. For example, when viewed on the plane, the light shielding pattern BM may overlap the sensing area SA (e.g., the photosensitive element OPD1).

The sensing portion SP1 in FIG. 10A represents the first electrodes E1-1 to E1-5 and the second electrodes E2-1 to E2-4 in FIG. 9A, and shape of the first electrodes E1-1 to E1-5 and the second electrodes E2-1 to E2-4 will be described in detail with reference to the sensing portion SP1 in FIG. 10A.

The sensing portion SP1 may include a plurality of line portions. The plurality of line portions overlap the light shielding pattern BM on the plane.

The sensing portion SP1 may include a first line portion CL1. As illustrated in FIGS. 10A and 10B, the first line portion CL1 defines an opening M-OP4 (hereinafter, referred to as a fourth opening) corresponding to the fourth opening B-OP4 in the light shielding pattern BM. On the plane, the fourth opening M-OP4 of the sensing portion SP1 may be disposed outside the fourth opening B-OP4 in the light shielding pattern BM.

The first line portion CL1 may be disposed between the fourth opening B-OP4 and each of the first to third openings B-OP1, B-OP2, and B-OP3. The first line portion CL1 is illustrated as defining a rectangular closed line on the plane, but this is merely an example. Two components extending in the first direction DR1 of the first line portion CL1 are respectively disposed between the fourth opening B-OP4 and the first opening B-OP1 and between the fourth opening B-OP4 and the third opening B-OP3. Two components extending in the second direction DR2 of the first line portion CL1 are respectively disposed between the fourth opening B-OP4 and two second opening B-OP2.

Referring to FIGS. 10A and 10B on the plane, a distance between the first line portion CL1 and the fourth opening B-OP4 may be less than that between the first line portion CL1 and each of the first to third openings B-OP1, B-OP2, and B-OP3. Referring to FIG. 10B, a distance between the first line portion CL1 and the second opening B-OP2 represents a distance between the first line portion CL1 and each of the first to third openings B-OP1, B-OP2, and B-OP3.

Referring to FIG. 10B a distance between the first line portion CL1 and the second opening B-OP2 is a first distance L1. An edge of the second opening B-OP2 may be an edge of the light shielding pattern BM defining the second opening B-OP2. The first distance L1 crossing the component extending in the second direction DR2 of the first line portion CL1 is measured in the first direction DR1.

A distance between the first line portion CL1 and the edge of the fourth opening B-OP4 is a second distance L2. An edge of the fourth opening B-OP4 may be an edge of the light shielding pattern BM defining the fourth opening B-OP4. As described above, the second distance L2 may be less than the first distance L1.

The first line portion CL1 is disposed more biased toward the first photosensitive element OPD1 than the red, green, and blue light emitting elements ED_R, ED_G1, and ED_B instead of being aligned at a center of the light shielding pattern BM. When viewed on the plane, the first line portion CL1 may overlap (e.g., may slightly or partially overlap) the first photosensitive element OPD1.

Because the first line portion CL1 is spaced relatively apart from the red, green, and blue light emitting elements ED_R, ED_G1, and ED_B, a difference between the first distance L1 and the second distance L2 may be greater than a line width of the first line portion CL1. The line width extending in the second direction DR2 of the first line portion CL1 is measured in the first direction DR1. Also, the first distance L1 may be greater than the line width of the first line portion CL1. The second distance L2 may be less than the line width of the first line portion CL1.

As described above, because the first line portion CL1 is disposed biased further toward the first photosensitive element OPD1, the leakage reflected light RL described with reference to FIG. 8B may not be incident on the first photosensitive element OPD1. As illustrated in FIG. 10B, the leakage reflected light RL may be incident to the black pixel defining layer PDL and absorbed to the pixel defining layer PDL.

Referring to FIG. 10A, the plurality of line portions may further include a second line portion CL2 overlapping the light shielding pattern BM and disposed between the first opening B-OP1 and the second opening B-OP2 and a third line portion CL3 overlapping the light shielding pattern BM and disposed between the second opening B-OP2 and the third opening B-OP3. Each of two second line portions CL2 and two third line portions CL2 may extend from the first line portion CL1. The two second line portions CL2 may extend in opposite directions from two vertices (or a portion adjacent to the vertices) disposed on a first diagonal line of the first line portion CL1, and the two third line portions CL3 may extend in opposite directions from two vertices disposed on a second diagonal line of the first line portion CL1.

One of the second line portions CL2 extends from the first line portion CL1 in a second cross direction CDR2 crossing the first direction DR1 and the second direction DR2. Although the two second line portions CL2 are not aligned along the same (imaginary) line, the present disclosure is not limited thereto. In an embodiment of the present disclosure, two second line portions CL2 may be disposed along the same line. One of the third line portions CL3 extends from the first line portion CL1 in a first cross direction CDR1 crossing the first direction DR1, the second direction DR2, and the second cross direction CDR2. Although the two third line portions CL3 are not aligned along the same (imaginary) line, the present disclosure is not limited thereto. In an embodiment of the present disclosure, two third line portions CL3 may be disposed along the same line.

According to an embodiment, two first line portions CL1, two second line portions CL2, and two third line portions CL3 are arranged around the first opening B-OP1. The two first line portions CL1 are spaced apart from each other with the first opening B-OP1 disposed therebetween in the second direction DR2. The two second line portions CL2 are spaced apart from each other with the first opening B-OP1 disposed therebetween in the first cross direction CDR1. The two third line portions CL3 are spaced apart from each other with the first opening B-OP1 disposed therebetween in the second cross direction CDR2.

The second line portions CL2 and the third line portions CL3 are spaced apart from the light emitting areas LA-R, LA-G1, and LA-B disposed adjacent thereto. The second line portions CL2 and the third line portions CL3 do not overlap the light emitting areas LA-R, LA-G1, and LA-B disposed adjacent thereto.

Two fourth line portions CL4 are further provided around the first opening B-OP1. The two fourth line portions CL4 are spaced apart from each other with the first opening B-OP1 disposed therebetween in the first direction DR1. Each of the two fourth line portions CL4 is disposed between the second line portion CL2 and the third line portion CL3, which are adjacent thereto. In some embodiments of the present disclosure, the fourth line portions CL4 may be omitted and the second line portions CL2 and the third line portions CL3 may be directly connected.

The two first line portions CL1, the two second line portions CL2, the two third line portions CL3, and the two fourth line portions CL4 define an opening M-OP1 corresponding to the first opening B-OP1 in the light shielding pattern BM. A third opening B-OP3 (hereinafter, referred to as a third opening) is defined by two first line portions CL1, two second line portions CL2, two third line portions CL3, and two fourth line portions CL4 similar to the first opening M-OP1 in the sensing portion SP1.

Two first line portions CL1, two second line portions CL2, and two third line portions CL3 are arranged around the second opening B-OP2. The two first line portions CL1 are spaced apart from each other with the second opening B-OP2 disposed therebetween in the first direction DR1. The two second line portions CL2 are spaced apart from each other with the second opening B-OP2 disposed therebetween in the first cross direction CDR1. The two third line portions CL3 are spaced apart from each other with the second opening B-OP2 disposed therebetween in the second cross direction CDR2. The two first line portions CL1, the two second line portions CL2, the two third line portions CL3, and the two fourth line portions CL4 define an opening M-OP1 corresponding to the first opening B-OP1 in the light shielding pattern BM.

The first line portion CL1 defines each of the fourth opening B-OP4 and the first to third openings B-OP1, B-OP2, and B-OP3 in common. Each of the second line portion CL2 and the third line portion CL3 define two openings disposed adjacent thereto from among the first to third openings -OP1, B-OP2, and B-OP3.

Referring to FIG. 10C, a distance L3 (hereinafter, referred to as a third distance) between the second line portion CL2 and the edge of the first opening B-OP1 and a distance L4 (hereinafter, referred to as a fourth distance) between the second line portion CL2 and the edge of the second opening B-OP2 are illustrated. Also, a distance L5 (hereinafter, referred to as a fifth distance) between the third line portion CL3 and the edge of the second opening B-OP2 and a distance L6 (hereinafter, referred to as a sixth distance) between the third line portion CL3 and the edge of the third opening B-OP3 are illustrated. Edges of the light shielding pattern BM may define the edges of the openings B-OP1, B-OP2, and B-OP3.

The third distance to the sixth distance L3 to L6 may be substantially the same as each other. A difference between the third distance to the sixth distance L3 to L6 may be less than about 0.1 µm. Each of the third distance to the sixth distance L3 to L6 is measured as a minimum distance between the corresponding edge of the opening and the corresponding line portion.

Figure 11B:
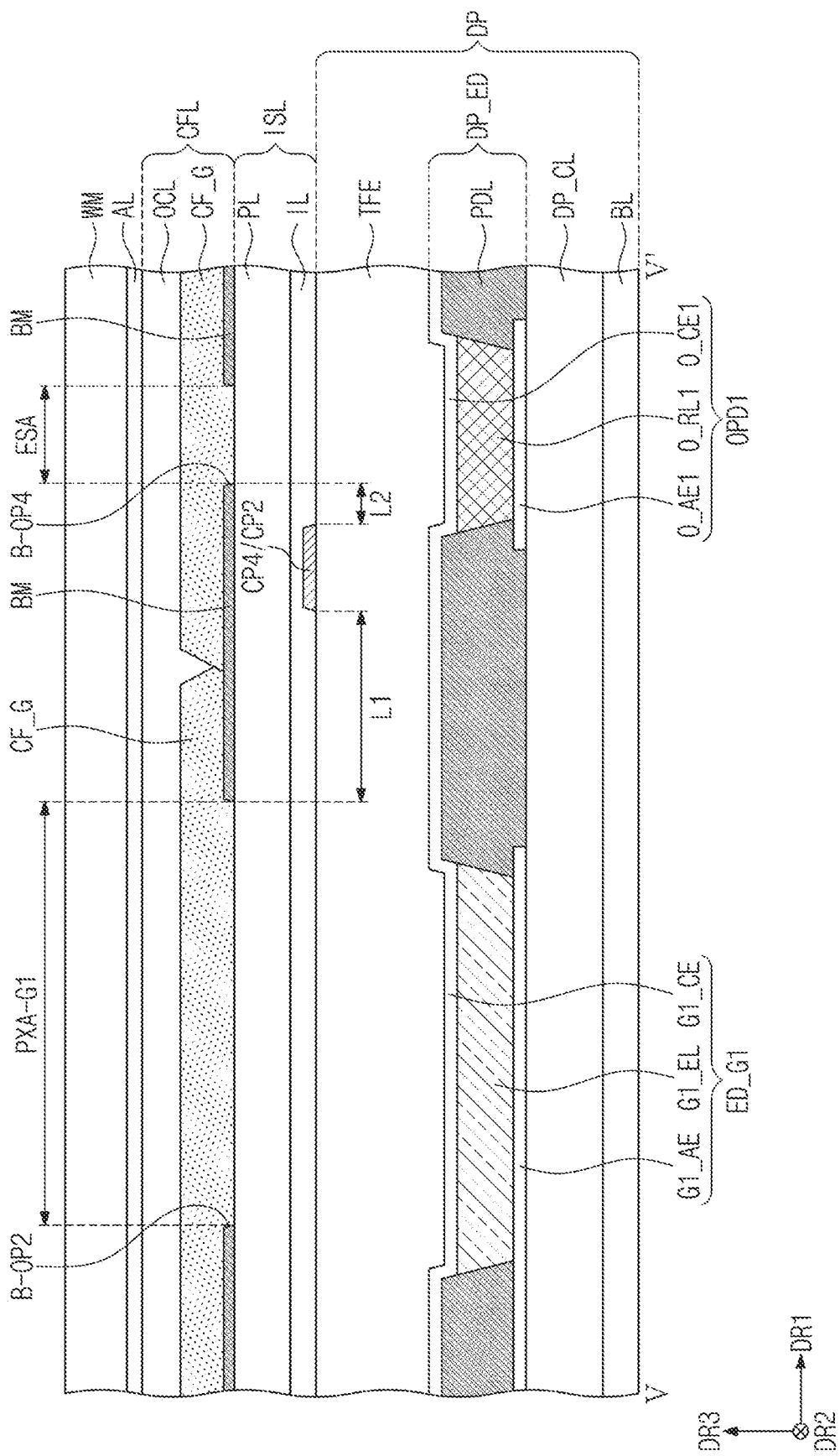
FIG. 11B is a cross-sectional view taken along the line V-V' of FIG. 11A.

FIG. 11A is a plan view illustrating the input sensor ISL according to an embodiment of the present disclosure, and FIG. 11B is cross-sectional view taken along the line V-V' of FIG. 11A.

FIG. 11A illustrates a plane corresponding to one bridge pattern CP2 of the bridge patterns CP2 shown in FIG. 9A. In FIG. 11A, the sensing portions SP1, the intermediate portions CP1, and the sensing patterns SP2 shown in FIG. 9A are not illustrated.

The bridge pattern CP2 may include a portion corresponding to one portion of the sensing pattern SP1 shown in FIG. 10A. For example, the bridge pattern CP2 may overlap the sensing pattern SP1 disposed thereabove.

The bridge pattern CP2 may include a plurality of line portions. The bridge pattern CP2 may include at least one portion corresponding to a component of the first line portion CL1, at least one second line portion CL2, at least one third line portion CL3, and at least one fourth line portion CL4.

As illustrated in FIG. 11B, the bridge pattern CP2 may be disposed between the first insulation layer IL and the second insulation layer PL. Because the arrangement relationship between the light shielding pattern BM and a component of the first line portion CL1 adjacent to the first photosensitive element OPD1 is described with reference to FIGS. 10A and 10B, a detailed description thereof will be omitted. Also, because the arrangement relationship between the second line portion CL2, the third line portion CL3, the fourth line portion CL4, and the light shielding pattern BM is described with reference to FIGS. 10A and 10B, a detailed description thereof will be omitted.

Figure 12:
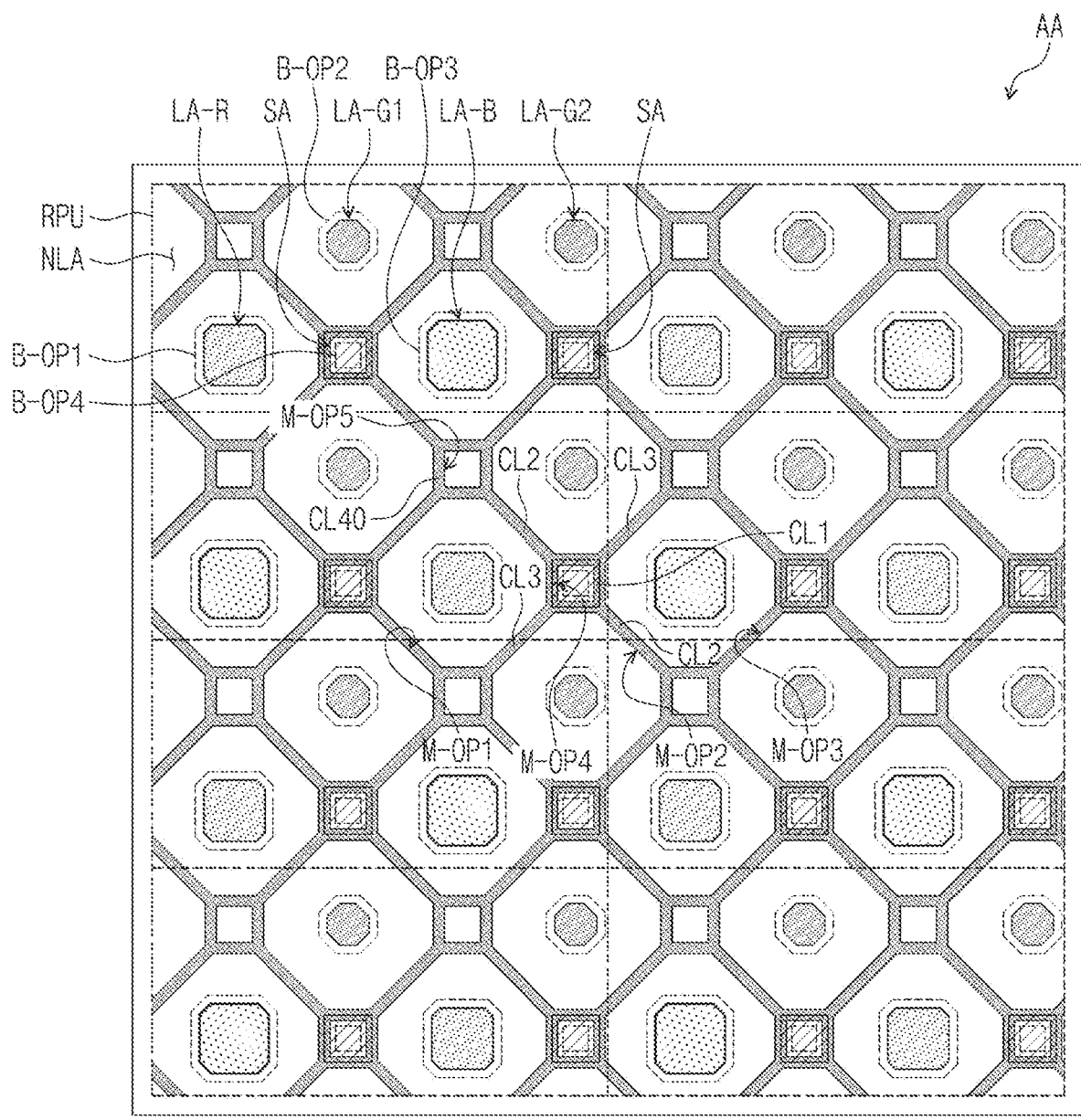
FIG. 12 is a plan view illustrating an input sensor according to an embodiment of the present disclosure.

FIG. 12 is a plan view illustrating the input sensor ISL according to an embodiment of the present disclosure. FIG. 12 illustrates a plane corresponding to the sensing portion SP1 shown in FIG. 10A.

Referring to FIG. 12, the fourth line portions CL4 in FIG. 10A may be replaced by fourth line portions CL40 having a closed line shape. The fourth line portions CL40 includes two components extending in the first direction DR1 and two components extending in the second direction DR2. Each of the fourth line portions CL40 defines an opening M-OP5 (hereinafter, referred to as a fifth opening). The fifth opening M-OP5 may overlap the light shielding pattern BM (see, e.g., FIG. 10B) because the opening in the light shielding pattern BM is not disposed on an area corresponding to the fifth opening M-OP5.

Different from the embodiment illustrated in FIG. 10A, two fourth line portions CL40 are related to a second opening M-OP2 in the sensing portion SP1. Two first line portions CL1, two second line portions CL2, two third line portions CL3, and two fourth line portions CL4 define the second opening M-OP2.

According to embodiments of the present disclosure, the light reflected by the sensing electrode may not be incident to the photosensitive element. By reducing the noise light incident to the photosensitive element, the fingerprint sensing performance of the photosensitive element may be improved.

Although embodiments of the present disclosure have been described, it is understood that the present disclosure is not limited to these embodiments but various changes and modifications can be made by one ordinary skilled in the art within the spirit and scope of the present disclosure, as defined by the following claims and their equivalents.

What is claimed is:

1. A display device comprising:
    a display panel comprising:
        a base layer;
        a pixel defining layer on the base layer, the pixel defining layer having a pixel opening and a photosensitive opening adjacent to the pixel opening;
        a light emitting element on the base layer, the light emitting element comprising a first color light emitting element, a second color light emitting element, and a third color light emitting element, one of the first color light emitting element, the second color light emitting element, and the third color light emitting element being in the pixel opening of the pixel defining layer;
        a photosensitive element on the base layer and in the photosensitive opening in the pixel defining layer; and
        a thin-film encapsulation layer covering the light emitting element and the photosensitive element; and
    an input sensor comprising a sensing electrode on the thin-film encapsulation layer,
    wherein the sensing electrode comprises a plurality of line portions, and
    wherein the plurality of line portions comprises a first line portion overlapping the pixel defining layer and the photosensitive opening on a plane.

2. The display device of claim 1, further comprising an anti-reflection layer on the input sensor,
    wherein the anti-reflection layer comprises a color filter and a light shielding pattern having a first opening corresponding to the pixel opening and a second opening corresponding to the photosensitive opening, and
    wherein the first opening has a first color opening corresponding to the first color light emitting element, a second color opening corresponding to the second color light emitting element, and a third color opening corresponding to the third color light emitting element.

3. The display device of claim 2, wherein the color filter overlaps the light emitting element and the photosensitive element.

4. The display device of claim 2, wherein the light shielding pattern overlaps the photosensitive element on the plane.

5. The display device of claim 2, wherein on the plane, the pixel opening entirely overlaps the first opening and the photosensitive entirely overlaps the second opening.

6. The display device of claim 2, wherein the photosensitive element is arranged at a center of an area defined by one first color light emitting element, two second color light emitting, and one third color light emitting element.

7. The display device of claim 2, wherein a shortest distance between the first line portion and an edge of the first opening is greater than a line width of the first line portion on a plane.

8. The display device of claim 2, wherein the first line portion is disposed between the first opening and the second opening on a plane, and
    wherein a shortest distance between the first line portion and an edge of the first opening is greater than a shortest distance between the first line portion and an edge of the second opening by a line width of the first line portion or more than the line width of the first line portion on a plane.

9. The display device of claim 1, wherein the pixel opening has a first pixel opening corresponding to the first color light emitting element, a second pixel opening corresponding to the second color light emitting element, and a third pixel opening corresponding to the third color light emitting element.

10. The display device of claim 9, wherein the plurality of line portions further comprises:
    a second line portion overlapping the pixel defining layer and arranged between the first pixel opening and the second pixel opening on the plane; and
    a third line portion overlapping the pixel defining layer and arranged between the second pixel opening and the third pixel opening on the plane,
    wherein, on the plane, the second line portion does not overlap the first color light emitting element and the second color light emitting element, and the third line portion does not overlap the second color light emitting element and the third color light emitting element.

11. The display device of claim 10, wherein a shortest distance between the second line portion and an edge of the first pixel opening is substantially equal to a shortest distance between the second line portion and an edge of the second pixel opening on a plane, and
    wherein a shortest distance between the third line portion and the edge of the second pixel opening is substantially equal to a shortest distance between the third line portion and an edge of the third pixel opening on a plane.

12. The display device of claim 1, wherein the first line portion comprises a first edge overlapping the pixel defining layer and a second edge overlapping the photosensitive opening on a plane.

13. The display device of claim 1, wherein the first line portion overlaps the photosensitive element in the photosensitive opening.

14. The display device of claim 1, wherein the first line portion has a closed line shape defining an opening corresponding to the photosensitive opening on the plane.

15. A display device comprising:
a display panel comprising:
- a base layer;
- a pixel defining layer on the base layer, the pixel defining layer having a pixel opening and a photosensitive opening adjacent to the pixel opening;
- a light emitting element on the base layer and in the pixel opening in the pixel defining layer;
- a photosensitive element on the base layer and in the photosensitive opening in the pixel defining layer; and
- a thin-film encapsulation layer covering the light emitting element and the photosensitive element; and an input sensor comprising a sensing electrode on the thin-film encapsulation layer,
wherein the sensing electrode comprises a plurality of line portions, and
wherein the plurality of line portions comprises a first line portion having a first edge and a second edge,
wherein the first edge overlaps the pixel defining layer on a plane, and
wherein the second edge overlaps the photosensitive element in the photosensitive opening on a plane.

16. The display device of claim 15, wherein the light emitting element comprises a first color light emitting element, a second color light emitting element, and a third color light emitting element, and
the pixel opening has a first pixel opening corresponding to the first color light emitting element, a second pixel opening corresponding to the second color light emitting element, and a third pixel opening corresponding to the third color light emitting element.

17. The display device of claim 16, wherein the plurality of line portions further comprises:
- a second line portion overlapping the pixel defining layer and arranged between the first pixel opening and the second pixel opening on the plane; and
- a third line portion overlapping the pixel defining layer and arranged between the second pixel opening and the third pixel opening on the plane, wherein, on the plane, the second line portion does not overlap the first color light emitting element and the second color light emitting element, and the third line portion does not overlap the second color light emitting element and the third color light emitting element.

18. The display device of claim 17, wherein a shortest distance between the second line portion and an edge of the first pixel opening is substantially equal to a shortest distance between the second line portion and an edge of the second pixel opening on a plane, and
wherein a shortest distance between the third line portion and the edge of the second pixel opening is substantially equal to a shortest distance between the third line portion and an edge of the third pixel opening on a plane.

19. The display device of claim 15, further comprising:
a color filter; and
a light shielding pattern having a first opening corresponding to the pixel opening and a second opening corresponding to the photosensitive opening, and
wherein the light emitting element comprises a first color light emitting element, a second color light emitting element, and a third color light emitting element, and
the first opening has a first color opening corresponding to the first color light emitting element, a second color opening corresponding to the second color light emitting element, and a third color opening corresponding to the third color light emitting element.

20. The display device of claim 19, wherein the color filter overlaps the light emitting element and the photosensitive element.

* * * * *